(12) United States Patent
Hirai et al.

(10) Patent No.: US 7,335,991 B2
(45) Date of Patent: Feb. 26, 2008

(54) PATTERN FORMING STRUCTURE, PATTERN FORMING METHOD, DEVICE, ELECTRO-OPTICAL DEVICE, AND ELECTRONIC APPARATUS

(75) Inventors: Toshimitsu Hirai, Chino (JP); Katsuyuki Moriya, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 186 days.

(21) Appl. No.: 11/213,864

(22) Filed: Aug. 30, 2005

(65) Prior Publication Data

US 2006/0071984 A1    Apr. 6, 2006

(30) Foreign Application Priority Data

Sep. 30, 2004    (JP) .............................. 2004-288695

(51) Int. Cl.
  *H01L 23/48*    (2006.01)
  *H01L 23/52*    (2006.01)
  *H01L 29/40*    (2006.01)

(52) U.S. Cl. .............................. 257/775; 257/E21.579; 438/625; 438/627; 438/629; 438/638

(58) Field of Classification Search ...................... None
  See application file for complete search history.

(56) References Cited

U.S. PATENT DOCUMENTS 6,028,362 A * 2/2000 Omura ........................ 257/774
6,541,861 B2 * 4/2003 Higashi et al. ............. 257/751
2004/0005739 A1 * 1/2004 Furusawa ................... 438/149
2004/0061822 A1 * 4/2004 Takeda et al. .............. 349/123
2004/0079941 A1 * 4/2004 Yamazaki et al. ............ 257/40
2005/0022374 A1    2/2005 Hirai et al.
2005/0140016 A1 * 6/2005 Shim et al. ................. 257/774
2005/0245079 A1    11/2005 Honda et al.

FOREIGN PATENT DOCUMENTS

| EP | 0 930 641 A2 | 7/1999 |
| EP | 1 478 016 A2 | 11/2004 |
| JP | A 11-274671 | 10/1999 |
| JP | A 2000-216330 | 8/2000 |
| JP | 2003-195329 | 7/2003 |
| JP | A 2004-89878 | 3/2004 |

\* cited by examiner

*Primary Examiner*—Minhloan Tran
*Assistant Examiner*—Leslie Pilar Cruz
(74) *Attorney, Agent, or Firm*—Oliff & Berridge, PLC

(57) ABSTRACT

There is provided a barrier structure provided with a concave portion corresponding to a pattern formed out of a functional liquid, the barrier structure comprising: a first concave portion provided in the barrier to correspond to a first pattern; and a second concave portion that is connected to the first pattern and is provided in the barrier to correspond to a second pattern having a width smaller than that of the first pattern, wherein the height of at least a part of the bottom surface of the second concave portion is greater than that of the bottom surface of the first concave portion.

14 Claims, 11 Drawing Sheets

C-C'  A-A'  B-B'

PATTERN FORMING STRUCTURE, PATTERN FORMING METHOD, DEVICE, ELECTRO-OPTICAL DEVICE, AND ELECTRONIC APPARATUS

This application claims the benefit of Japanese Patent Application No. 2004-288695, filed Sep. 30, 2004. The entire disclosure of the prior application is hereby incorporated by reference herein in its entirety.

BACKGROUND OF THE INVENTION

1. Technical Field

The present invention relates to a pattern forming structure, a pattern forming method, a device, an electro-optical device, and an electronic apparatus.

2. Related Art

As a method of forming wires in a predetermined pattern used in electronic circuits or integrated circuits, for example, a photolithography process is widely used. The photolithography process requires large-scaled apparatuses such as a vacuum apparatus, an exposing apparatus, and the like. In order to form wires or the like in a predetermined pattern by using the apparatuses, complex processes are required and use efficiency of materials is merely a low percentage, thereby consuming most the materials. Therefore, there is a problem with high manufacturing cost.

On the other hand, there is suggested a method of forming wires in a predetermined pattern on a substrate by using a liquid droplet ejecting method of ejecting a liquid material in droplets from a droplet ejecting head, that is, a so-called inkjet method (For example, see Japanese Unexamined Patent Application Publications Nos. H11-274671 and 2000-216330). In the inkjet method, a patterning liquid material (functional liquid) is directly placed in a pattern on the substrate and then is converted into the pattern by performing heat treatment or laser irradiation. Accordingly, since the inkjet method does not require the photolithography process, the processes can be remarkably simplified and the original material can be placed directly in a desired pattern position. As a result, it is possible to reduce the amount of functional liquid to be used.

Japanese Unexamined Patent Application Publications Nos. H11-274671 and 2000-216330 are examples of the related arts.

Recently, the degree of integration of circuits constituting devices has been increasing and thus, for example, decrease in size and width of wire patterns is required. In forming patterns using the liquid droplet ejecting method, since the ejected liquid droplets are diffused on the substrate after reaching the substrate surface, it is difficult to stably form micro patterns. Specifically, when a pattern serves as a conductive film, liquid-collected portions (bulges) occur due to the diffusion of the liquid droplets, thereby causing disconnection or shortcircuit.

Accordingly, there is suggested a technique of forming wire patterns with a width smaller than the droplet diameter of the functional liquid ejected by the liquid droplet ejecting method, by ejecting a functional liquid to a wire forming area in a state where the surface of the banks partitioning the wiring-pattern forming area becomes lyophobic. In this way, by forming the banks partitioning the wiring-pattern forming area, the functional liquid can flow in the whole wiring-pattern forming area even when a part of the functional liquid is ejected to the top surface of the banks.

However, when the micro wire patterns are formed with a capillary phenomenon, the micro wire patterns formed with the capillary phenomenon becomes thinner than other wire patterns. Accordingly, a step due to the difference in thickness of the wire patterns can be generated on the surfaces of the micro wire patterns and other wire patterns. Furthermore, when wire patterns are further stacked on the surface of the banks including the wire patterns, the disconnection and the shortcircuit due to the step can occur.

SUMMARY

An advantage of the invention is that it provides a bank structure in which the heights of a micro pattern and other patterns are made to be equal to each other so as to flatten an area including the top surface of the patterns, a pattern forming method, an electro-optical device, and an electronic apparatus.

According to an aspect of the invention, there is provided a barrier structure provided with a concave portion corresponding to a pattern formed out of a functional liquid, the barrier structure comprising: a first concave portion provided in the barrier to correspond to a first pattern; and a second concave portion that is connected to the first pattern and is provided in the barrier to correspond to a second pattern having a width smaller than that of the first pattern, wherein the height of the bottom surface of the second concave portion is greater than that of the bottom surface of the first concave portion.

Here, the width of the first pattern means a length from one end of the first pattern to the other end in the direction perpendicular to the extending direction of the first pattern. The width of the second pattern means a length from the intersection between the first pattern and the second pattern to one end of the second pattern in the direction perpendicular to the extending direction of the second pattern.

Generally, when a pattern is formed in the second concave portion as a micro pattern with a capillary phenomenon, the thickness of the micro pattern in the second concave portion is smaller than the thickness of other patterns. On the contrary, according to the invention, the height of the bottom surface of the second concave portion is greater than the height of the bottom surface of the first concave portion. As a result, the functional liquid disposed in the second concave portion is positioned higher than the functional liquid disposed in the first concave portion. Therefore, since the height of the first pattern formed in the first concave portion and the height of the second pattern formed in the second concave portion can be made to be equal, a step difference on the top surfaces of the first pattern in the first concave portion and the second pattern in the second concave portion due to the difference in thickness can be avoided, thereby forming a flat area on the top surface of the first pattern, the second pattern, and the barrier. As a result, even when a predetermined pattern is further stacked on the flat area, the disconnection and shortcircuit of the pattern due to the step difference can be prevented.

The barrier may contain a photosensitive material.

According to the construction described above, the barrier material has a function as a barrier for preventing the wet diffusion of the functional liquid and a function as a photo resist. Therefore, it is possible to prevent the wet diffusion of the functional liquid and also to directly expose and develop the barrier material with a photolithography process. As a result, since it is not necessary to additionally apply a photo resist on the barrier material, the simplification of a bank forming process and decrease in cost can be accomplished.

The barrier may contain a lyophilic material.

According to the construction described above, when a pattern is formed in the second concave portion as the micro pattern with the capillary phenomenon, it is possible to keep lyophilic the bottom surface of the second concave portion without performing a lyophilic process to the pattern forming surface of the second concave portion, because the bottom surface of the second concave portion is lyophilic. As a result, since the functional liquid ejected to the surface of the first concave portion and the second concave portion is wet-diffused to the whole surface of the concave portions, it is possible to prevent the disconnection of the pattern and to omit the lyophilic process.

A contact angle of the functional liquid disposed in the second concave portion about the bottom surface of the second concave portion may be smaller than or equal to a contact angle of the functional liquid disposed in the first concave portion about the bottom surface of the first concave portion.

According to the construction described above, the contact angle of the functional liquid disposed in the second concave portion about the bottom surface of the second concave portion is smaller than the contact angle of the functional liquid disposed in the first concave portion about the bottom surface of the first concave portion. As a result, when the functional liquid flows in the second concave portion with the capillary phenomenon, the functional liquid tends to be wet-diffused toward the second concave portion having a small contact angle. Therefore, the inflow of the functional liquid into the second concave portion with the capillary phenomenon is promoted and thus the height of the pattern formed in the first concave portion and the height of the pattern formed in the second concave portion can be made to be equal. Accordingly, a step difference on the top surfaces of the first pattern in the first concave portion and the second pattern in the second concave portion due to the difference in thickness can be avoided, thereby forming a flat area on the top surface of the first pattern, the second pattern, and the barrier. As a result, since a predetermined pattern can be further stacked on the flat area, the disconnection and shortcircuit of the pattern due to the step difference can be prevented.

According to another aspect of the present invention, there is provided a method of forming a barrier structure having concave portions corresponding to a plurality of patterns on a substrate, the method comprising: applying a barrier material onto the substrate; and forming a barrier having a first concave portion corresponding to a first pattern and a second concave portion corresponding to a second pattern, which is connected to the first pattern and which has a width smaller than that of the first pattern, wherein in forming the barrier, the height of the bottom surface of the second concave portion is formed to be greater than that of the bottom surface of the first concave portion.

In the method of forming a barrier structure according to the invention, the height of the bottom surface of the second concave portion is greater than the height of the bottom surface of the first concave portion. As a result, the functional liquid disposed in the second concave portion is positioned in the bottom surface higher than the functional liquid disposed in the first concave portion. Therefore, it is possible to make equal the height of the first pattern formed in the first concave portion and the height of the second pattern formed in the second concave portion. Accordingly, a step difference on the top surfaces of the first pattern in the first concave portion and the second pattern in the second concave portion due to the difference in thickness can be avoided, thereby forming a flat area on the top surface of the first pattern, the second pattern, and the barrier. As a result, since a predetermined pattern can be further stacked on the flat area, the disconnection and shortcircuit of the pattern due to the step difference can be prevented.

According to still another aspect of the invention, there is provided a method of forming a barrier structure having concave portions corresponding to a plurality of patterns on a substrate, the method comprising: applying a barrier material onto the substrate; applying a resist on the barrier material; patterning the resist in a predetermined shape; and forming a barrier having a first concave portion corresponding to a first pattern and a barrier having a second concave portion corresponding to a second pattern, which is connected to the first pattern and which has a width smaller than that of the first pattern, by etching the barrier material in predetermined patterns using the resist as a mask, wherein in forming the barrier, the height of the bottom surface of the second concave portion is formed to be greater than that of the bottom surface of the first concave portion.

In the method of forming a barrier structure, the barrier material does not contain a photosensitive material. However, the method can accomplish the same advantages as the method of forming a barrier structure described above.

The barrier material applied onto the substrate may be subjected to a lyophobic process.

According to the construction described above, when the functional liquid is disposed on the top surfaces of the first concave portion and the second concave portion, the contact angle of the functional liquid about the top surfaces having been subjected to the lyophobic process can be reduced. Accordingly, the functional liquid disposed on the top surface of the barrier is rebounded and the rebounded functional liquid flows in the first concave portion and the second concave portion. As a result, the attachment of the functional liquid to the top surface of the barrier can be avoided and thus the disconnection and shortcircuit of a pattern on the flat area due to the remaining functional liquid can be prevented.

The second concave portion may be formed using a half-tone exposure.

According to the construction described above, it is possible to control the exposure light passing through the photo mask with the half-tone exposure. That is, by providing a diffraction pattern such as a slit in a part of openings in the photo mask, the permeability of the exposure light can be decreased in the photo mask area and can be irradiated to the barrier. As a result, it is possible to perform the exposure and development while leaving a predetermined thickness of patterns on the bottom surface of the second concave portion. Therefore, since the bottom surface of the second concave portion can be formed to be higher than the bottom surface of the first concave portion, the disconnection and shortcircuit of a pattern due to the step difference can be prevented.

The surface of the first concave portion on which the first pattern should be formed may be subjected to a lyophobic process and the surface of the second concave portion on which the second pattern should be formed may be subjected to a lyophilic process.

Since the surface of the first concave portion on which the first pattern should be formed is subjected to a lyophobic process, the contact angle about the barrier material is great and thus it is difficult to wet-diffuse the functional liquid disposed in the area. On the other hand, since the surface of the second concave portion on which the second pattern should be formed is subjected to a lyophilic process, the contact angle about the barrier material is small and thus it is easy to wet-diffuse the functional liquid disposed in the area. Therefore, when the functional liquid is disposed in the first concave portion, the functional liquid easily flows in the second concave portion, which is subjected to the lyophilic process and has a small contact angle. As a result, the inflow of the functional liquid into the second concave portion with the capillary phenomenon is promoted and the thickness of the pattern formed in the first concave portion and the thickness of the pattern formed in the second concave portion can be made equal, thereby preventing the disconnection and shortcircuit of the pattern due to the step difference.

According to still another aspect of the invention, there is provided a device comprising the barrier structure and the patterns formed in the first concave portion and the second concave portion of the barrier structure.

In the device according the invention, the height of the bottom surface of the second concave portion is greater than the height of the bottom surface of the first concave portion. As a result, the functional liquid disposed in the second concave portion is positioned higher than the functional liquid disposed in the first concave portion. Therefore, since the height of the first pattern formed in the first concave portion and the height of the second pattern formed in the second concave portion can be made to be equal, a step difference on the top surfaces of the first pattern in the first concave portion and the second pattern in the second concave portion due to the difference in thickness can be avoided, thereby forming a flat area on the top surface of the first pattern, the second pattern, and the barrier. As a result, even when a predetermined pattern is further stacked on the flat area, the disconnection and shortcircuit of the pattern due to the step difference can be prevented.

The first pattern may be a gate wire and the second pattern may be a gate electrode.

By using the above-mentioned barrier structure, it is possible to make equal the heights of the gate wire and the gate electrode. As a result, a flat area can be formed on the top surfaces of the gate wire, the gate electrode, and the barrier, thereby preventing the shortcircuit, disconnection, and the like of the wires formed on the top surfaces.

The first pattern may be a source wire and the second pattern may be a source electrode.

By using the above-mentioned barrier structure, it is possible to make equal the heights of the source wire and the source electrode. As a result, a flat area can be formed on the top surfaces of the source wire, the source electrode, and the barrier, thereby preventing the shortcircuit, disconnection, and the like of the wires formed on the top surfaces.

According to still another aspect of the invention, there is provided an electro-optical device comprising the above-mentioned device. According to still another aspect of the invention, there is provided an electronic apparatus comprising the electro-optical device.

According to the constructions described above, since the device with high precision is provided, it is possible to embody an electro-optical device and an electronic apparatus with improved quality and performance.

In the invention, the electro-optical device includes a device for converting electric energy into optical energy, in addition to a device having an electro-optical effect of varying the permeability of light by use of variation of diffraction index of a material due to an electric field. Specifically, the examples of the electro-optical device can include a liquid crystal display device using liquid crystal as an electro-optical material, an organic electroluminescence (EL) display device using an organic EL material as the electro-optical material, an inorganic EL display device using an inorganic EL material as the electro-optical material, and a plasma display device using a plasma gas as the electro-optical material. The examples can further include an electrophoresis display (EPD) device, a field emission display (FED) device, and the like.

BRIEF DESCRIPTION OF THE DRAWING

The invention will be described with reference to the accompanying drawings, wherein like numbers reference like elements and wherein.

DESCRIPTION OF THE EMBODIMENTS

First Embodiment

Figure 1:
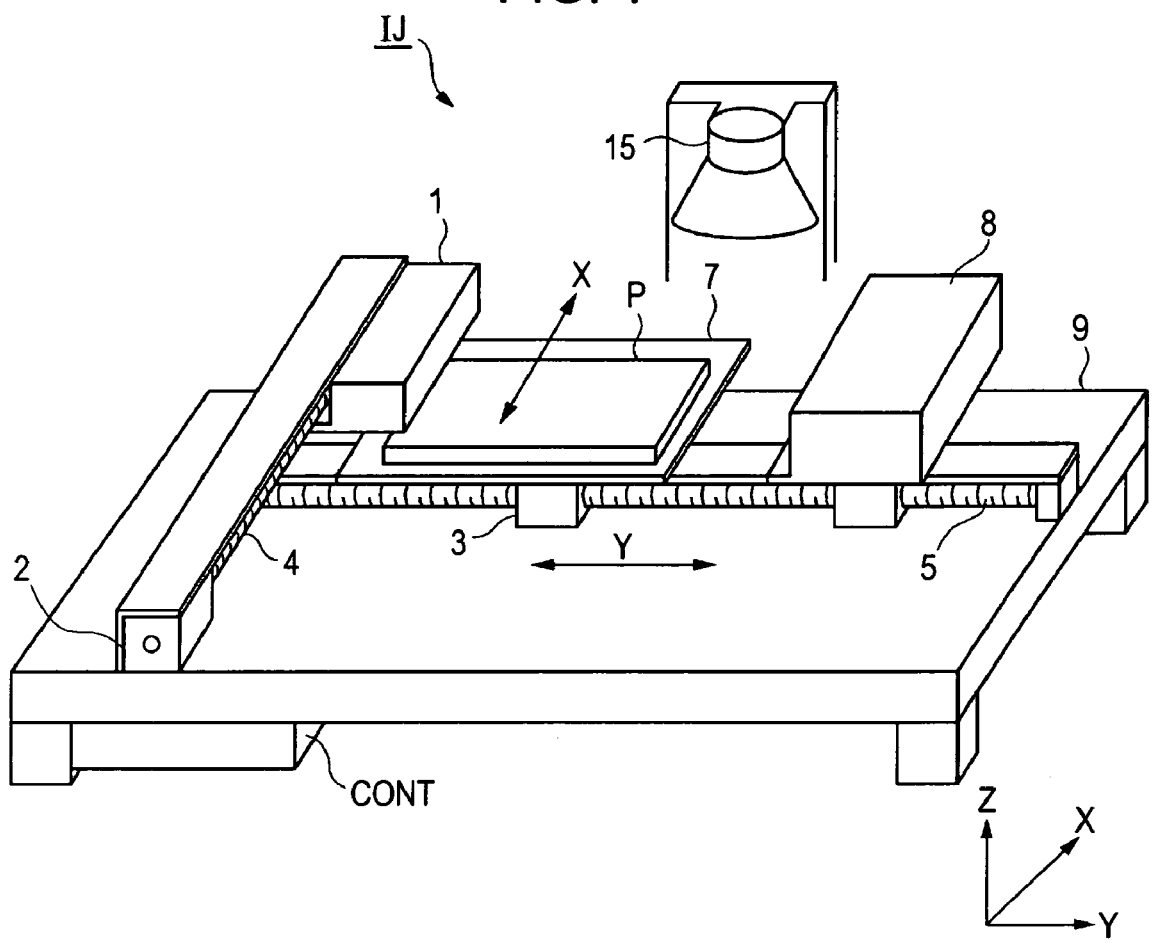
FIG. 1 is a perspective view schematically illustrating a liquid droplet ejecting apparatus according to the present invention.

Now, a first embodiment of the present invention will be described with reference to the drawings. Embodiments described later show examples of the invention, but are not intended to limit the invention. In order to sufficiently recognize layers and members from the drawings, scales of the layers and members are properly changed in the drawings used in the following description.

(Liquid Droplet Ejecting Apparatus)

First, a liquid droplet ejecting apparatus for forming banks according to the first embodiment will be described with reference to FIG. 1.

FIG. 1 is a perspective view illustrating a schematic construction of the liquid droplet ejecting apparatus (inkjet apparatus) IJ for providing a liquid material on a substrate by using a liquid droplet ejecting method as an example of an apparatus used for the pattern forming method according to the invention.

The liquid droplet ejecting apparatus IJ includes a droplet ejecting head 1, an X direction driving axis 4, a Y direction guide axis 5, a controller CONT, a stage 7, a cleaning mechanism 8, a stand 9, and a heater 15.

The stage 7 supports the substrate P on which ink (liquid material) is provided by the liquid droplet ejecting apparatus IJ and includes a fixing mechanism not shown for fixing the substrate P to a reference position.

The droplet ejecting head 1 is a multi-nozzle type droplet ejecting head having a plurality of ejecting nozzles. Here, the longitudinal direction thereof corresponds to the Y axis direction. A plurality of ejecting nozzles is provided at a constant interval in the Y axis direction on the lower surface of the droplet ejecting head 1. The ink containing conductive particles is ejected to the substrate P supported by the stage 7 from the ejecting nozzles of the droplet ejecting head 1.

The X direction driving axis 4 is connected to an X direction driving motor 2. The X direction driving motor 2 may be a stepping motor and rotates the X direction driving axis 4 in response to an x direction driving signal from the controller CONT. When the X direction driving axis 4 is rotated, the droplet ejecting head 1 is moved in the X axis direction.

The Y direction guide axis 5 is fixed to the stand 9. The stage 7 includes a Y direction driving motor 3. The Y direction driving motor 3 may be a stepping motor and moves the stage 7 in the Y axis direction in response to a Y direction driving signal from the controller CONT.

The controller CONT supplies a droplet ejection control voltage to the droplet ejecting head 1. The controller supplies a driving pulse signal for controlling the movement of the droplet ejecting head 1 in the X direction to the X direction driving motor 2 and supplies a driving pulse signal for controlling the movement of the stage 7 in the Y direction to the Y direction driving motor 3.

The cleaning mechanism 8 cleans the droplet ejecting head 1. The cleaning mechanism 8 includes a Y direction driving motor not shown. The cleaning mechanism 8 is moved along the Y direction guide axis 5 by means of operation of the Y direction driving motor. The movement of the cleaning mechanism 8 is also controlled by the controller CONT.

The heater 15 is a device for heating the substrate P by means of the annealing with a lamp and performs vaporization and drying of the solvent contained in the liquid material applied onto the substrate P. The operation of the heater 15 is also controlled by the controller CONT.

The liquid droplet ejecting apparatus IJ ejects liquid droplets to the substrate P while allowing the droplet ejecting head 1 to relatively scan the stage 7 supporting the substrate P. Hereinafter, the X direction is referred to as a scan direction and the Y direction perpendicular to the X direction is referred to as a non-scan direction. Accordingly, the ejecting nozzles of the droplet ejecting head 1 are placed at a constant interval in the Y direction which is the non-scan direction. In FIG. 1, the droplet ejecting head 1 is disposed perpendicular to the moving direction of the substrate P, but the direction of the droplet ejecting head 1 may be adjusted to intersect the moving direction of the substrate P. As a result, by adjusting the direction of the droplet ejecting head 1, it is possible to adjust the pitch between the nozzles. A distance between the substrate P and the nozzle surface may be adjusted.

Figure 2:
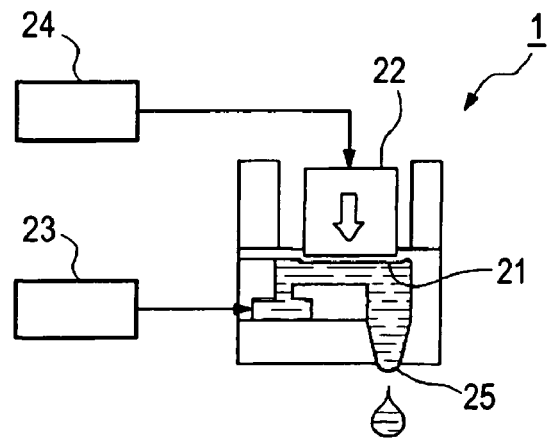
FIG. 2 is a diagram illustrating a principle of ejecting a liquid material by using a piezoelectric method.

FIG. 2 is a diagram illustrating a principle of ejecting the functional liquid L with a piezoelectric method.

In FIG. 2, a piezoelectric element 22 is provided adjacent to a liquid room 21 for receiving the functional liquid L. The liquid room 21 is supplied with the functional liquid L through a functional liquid supply system 23 including a material tank for storing the functional liquid L.

The piezoelectric element 22 is connected to a driving circuit 24. By applying a voltage to the piezoelectric element 22 through the driving circuit 24 and deforming the piezoelectric element 22, the liquid room 21 is deformed and thus the functional liquid L is ejected from the nozzles 25. In this case, the amount of distortion of the piezoelectric element 22 is controlled by varying the value of the applied voltage. In addition, the speed of distortion of the piezoelectric element 22 is controlled by varying the frequency of the applied voltage.

In addition to the piezoelectric method of ejecting ink using the above-mentioned piezoelectric element, various known techniques such as a bubble method of ejecting the functional liquid L using bubbles generated by heating the functional liquid L and the like can be used in the principle of ejecting the functional liquid L. In the piezoelectric technique among the above-mentioned techniques, since the functional liquid L is not heated, it does not affect the material composition.

Here, the functional liquid L is made of a dispersion liquid in which conductive particles are dispersed in a dispersion medium or a solution in which organic silver compound or silver oxide particles are dispersed in a solvent (dispersion medium).

In addition to metal particles including any one of gold, silver, copper, palladium, and nickel, particles of oxides thereof, conductive polymers, and super-conductors may be used as the conductive particles.

The conductive particles may be coated with organic substances so as to improve the dispersion property. Examples of the coating agent coated on the surfaces of the conductive particles can include an organic solvent such as xylene and toluene or citric acid.

It is preferable that the diameter of the conductive particles is in the range from 1 to 0.1 µm. When the particle diameter is greater than 0.1 µm, the nozzles of the droplet ejecting head to be described later may be clogged. When the particle diameter is smaller than 1 nm, the volume ratio of the coating agent in the conductive particles is increased and thus the ratio of organic substances contained in the resultant film is too great.

The dispersion medium is not particularly limited if only it can disperse the conductive particles and does not cause cohesion. Examples of the dispersion medium may include water; alcohols such as methanol, ethanol, propanol, butanol, etc.; hydrocarbon compounds such as n-heptane, n-octane, decane, dodecane, tetradecane, toluene, xylene, cymene, durene, indene, dipentene, tetrahydro naphthalene, decahydro naphthalene, cyclohexyl benzene, etc.; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc.; polar compounds such as propylene carbonate, γ-butyrolactone, B-methyl-2-pyrrolidone, dimethyl formamide, dimethyl sulfoxide, cyclohexanone, etc.; and so on. Among the above-mentioned compounds, from the view point of a dispersion property of particles, stability of a dispersion liquid, and easy application to the liquid droplet ejecting method (inkjet method), water, alcohols, hydrocarbon compounds, and ether compounds are preferable as the dispersion medium, and water and hydrocarbon compounds are more preferable as the dispersion medium.

It is preferable that the surface tension of the solution in which the conductive particles are dispersed is in the range from 0.02 to 0.07 N/m. In ejecting a liquid by the inkjet method, when the surface tension is smaller than 0.02 N/m, wettability of the ink composition on the nozzle surface is increased and thus the bent flying can be easily caused. On the other hand, when the surface tension is greater than 0.07 N/m, the meniscus shape at the nozzle ends is not stabilized and thus it is difficult to control the amount of ejection or the timing of ejection. In order to adjust the surface tension, a surface tension adjusting agent such as a fluorine agent, a silicon agent, and a nonionic agent may be slightly added to the dispersion liquid within a range in which a contact angel about the substrate is not greatly decreased. The nonionic surface-tension adjusting agent improves the wettability of a liquid on the substrate and the level property of a film, thereby preventing micro unevenness of the film. The surface-tension adjusting agent may contain organic compounds such as alcohol, ether, ester, and ketone as needed.

It is preferable that the viscosity of the dispersion liquid is in the range from 1 to 50 m·Pa·s. In ejecting a liquid material in droplets by using the inkjet method, when the viscosity is smaller than 1 m·Pa·s, the surroundings of the nozzles can be easily contaminated due to the outflow of ink. When the viscosity is greater than 50 m·Pa·s, the frequency of clogging of the nozzles is increased, thereby making it difficult to smoothly eject the liquid droplets.

(Bank Structure)

Next, the bank structure for disposing the functional liquid (ink) according to the first embodiment will be described with reference to FIGS. 3A to 3C.

Figure 3A:
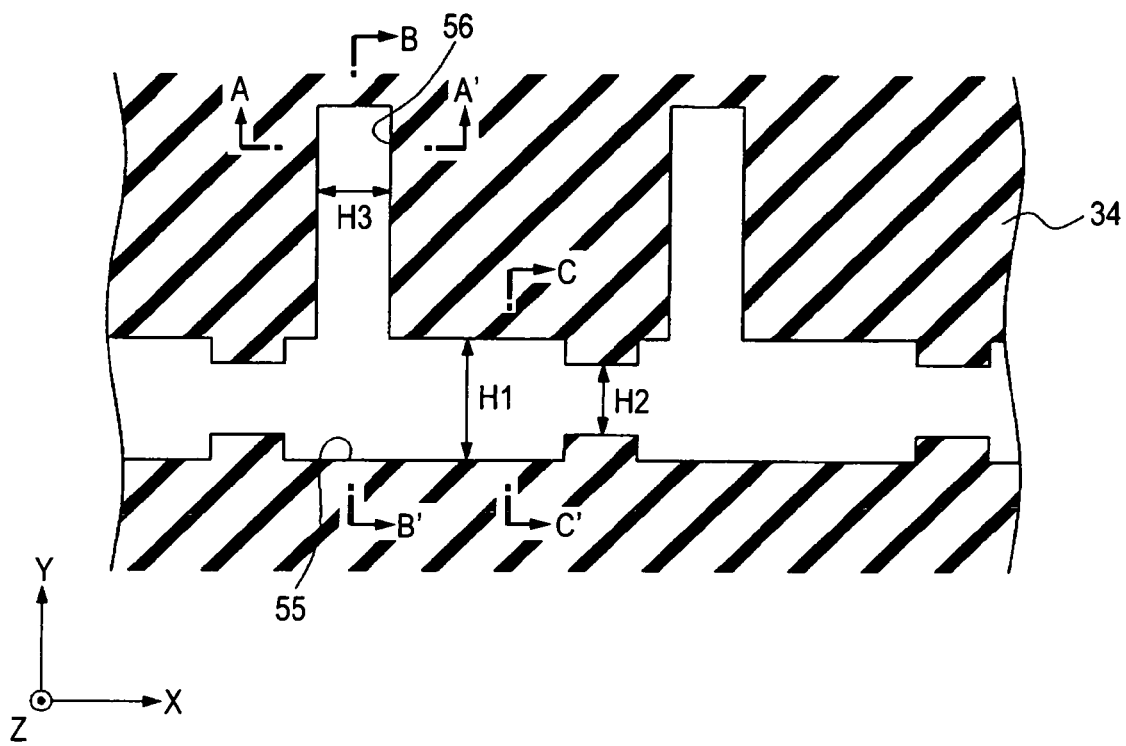
FIG. 3A is a plan view schematically illustrating a bank structure and FIGS. 3B and 3C are cross-sectional views of the bank structure shown in FIG. 3A.

FIG. 3A is a plan view schematically illustrating the bank structure. FIG. 3B is a cross-sectional view of the bank structure taken along Line A-A' of FIG. 3A. FIG. 3C is a cross-sectional view of the bank structure taken along Line B-B' of FIG. 3A.

As shown in FIG. 3A, the bank structure according to the first embodiment includes banks 34 formed on a substrate 48 and groove portions formed by the banks 34 to correspond to predetermined wire patterns.

The groove portions formed in the banks 34 to correspond to the predetermined wire patterns include a first groove portion 55 and a second groove portion 56.

The first groove portion 55 (first concave portion) extends in the X direction of FIG. 1A and has a first width H1 and a second width H2. The first width H1 of the first groove portion 55 is formed in the region corresponding to the portion connected to the second groove portion 56 so as to allow the functional liquid to flow in the second groove portion 56 (second concave portion) with the capillary phenomenon as described later and becomes a wide wire pattern so as to facilitate the placement of the functional liquid L. That is, the first width H1 of the first groove portion 55 is formed in a wire pattern width greater than the diameter of droplets of the functional liquid L ejected from the liquid droplet ejecting apparatus IJ. The second width H2 of the first groove portion 55 is smaller than the first width H1 of the first groove portion 55 so as to allow the functional liquid L to flow in the region having the first width H1 of the first groove portion 55 with the capillary phenomenon.

On the other hand, the second groove portion 56 is vertically connected to the region having the first width H1 of the first groove portion 55 and extends in the Y axis direction of FIG. 1A. The second groove portion 56 has a third width H3 and the third width H3 of the second groove portion 56 is smaller than the first width H1 of the first groove portion 55 and is approximately equal to the second width H2 of the first groove portion 55.

In this way, since the third width H3 of the second groove portion 56 is smaller than the first width H1 of the first groove portion 55, the functional liquid L disposed in the region having the first width H1 of the first groove portion 55 can flow in the second groove portion 56 by using the capillary phenomenon.

Next, a sectional structure of the groove portions of the bank structure according to the first embodiment will be described with reference to FIGS. 3B and 3C.

Figure 3B:
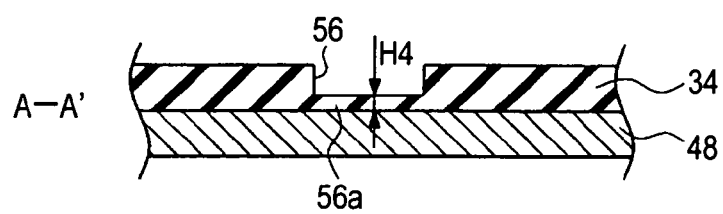
Figure 3C:
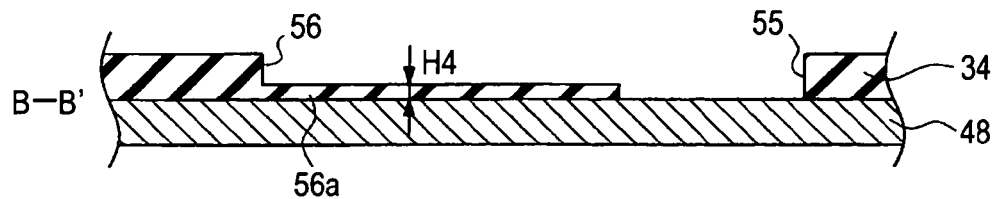

As shown in FIGS. 3B and 3C, a bottom raising portion 56a for raising the whole bottom surface of the second groove portion 56 is formed on the bottom surface of the second groove portion 56 and the bottom raising portion 56a has a predetermined thickness H4. Accordingly, a step difference due to the bottom raising portion 56a of the second groove portion 56 is formed in the boundary between the second groove portion 56 and the first groove portion 55. In the present embodiment, since the bottom raising portion 56a having a predetermined thickness H4 is formed on the bottom surface of the second groove portion, the bottom surface of the second groove portion 56 is higher than the bottom surface of the first groove portion 55.

In the embodiment, the bottom raising portion 56a of the second groove portion 56 is formed on the whole bottom surface of the second groove portion 56. However, it is also preferable that the bottom raising portion is formed on a part of the bottom surface of the second groove portion 56 and the part of the bottom surface is higher than the bottom surface of the first groove portion 55.

According to the embodiment, since the bottom surface of the second groove portion 56 is higher than the bottom surface of the first groove portion 55, the functional liquid L placed in the second groove portion 56 is located in the region higher than the functional liquid L placed in the first groove portion 55. Therefore, the bottom surface of the second groove portion 56 is raised and thus the height of the wire pattern formed in the first groove portion 55 and the height of the wire pattern formed in the second groove portion 56 can be made to be equal. As a result, the step difference due to the difference in thickness between the wire pattern formed in the second groove portion 56 and the wire pattern formed in the first groove portion 55 can be prevented, thereby forming a flat region on the wire patterns and the bank. Accordingly, it is possible to prevent the shortcircuit or disconnection of wire patterns formed on the banks 34 including the wire patterns.

(Bank Structure and Pattern Forming Method)

FIG. 4 is a cross-sectional view illustrating a method of forming a bank structure and a pattern in the order of processes. The left figures in FIG. 4 are cross-sectional views illustrating a process of forming a wire pattern 40 in the first groove portion 55, which are taken along Line C-C' of FIG. 3 (hereinafter, referred to as first region). Similarly, the center figures in FIG. 4A are cross-sectional views illustrating a process of forming a wire pattern 41 in the second groove portion 56, which are taken along Line A-A' of FIG. 3 (hereinafter, referred to as second region). The right figures in FIG. 4 are cross-sectional views illustrating a process of forming the wire patterns 40 and 41 in the first groove portion 55 and the second groove portion 56, which are taken along Line B-B' of FIG. 3. FIGS. 5A and 5B are cross-sectional views illustrating a process of forming a wire pattern.

(Bank Material Coating Process)

Figure 4A:
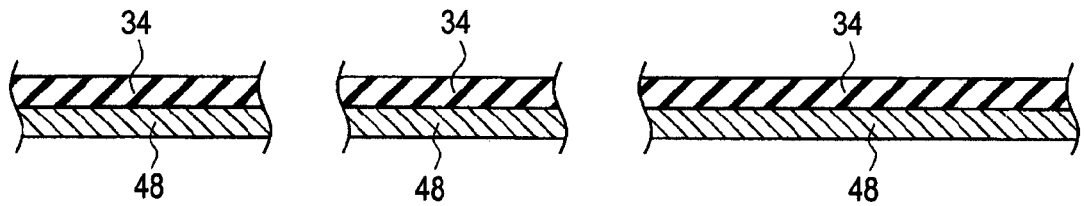
FIG. 4 is a cross-sectional view illustrating a process of forming a wire pattern.
Figure 5A:
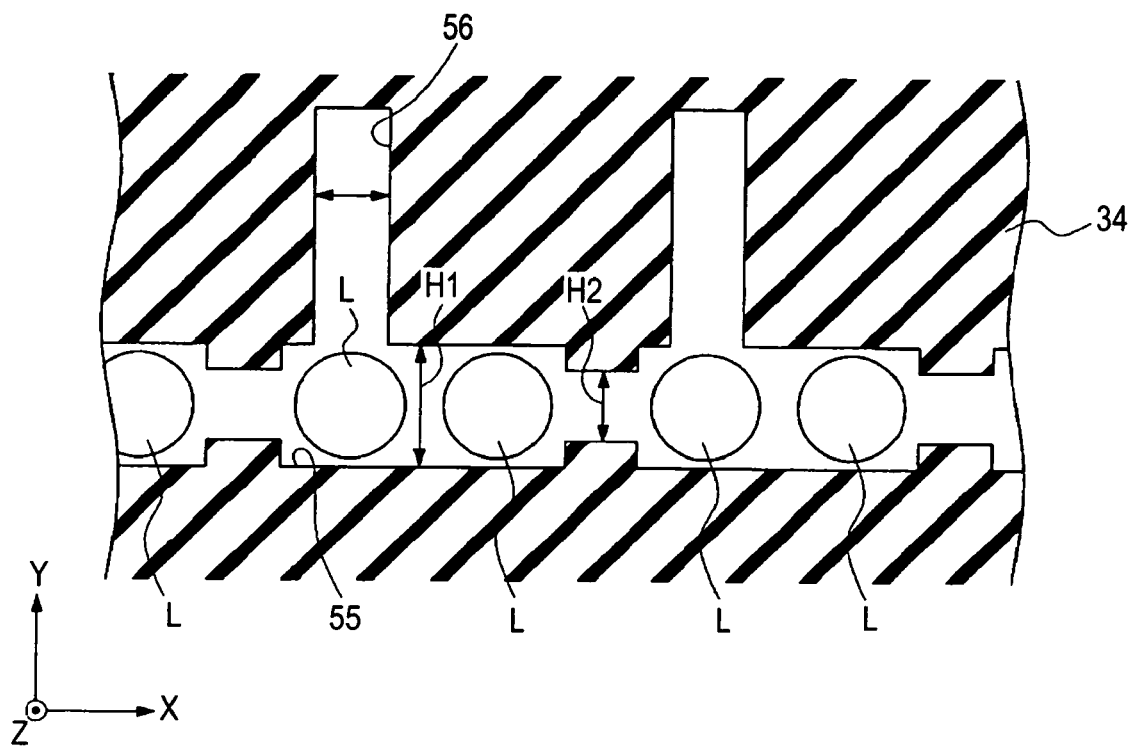
FIGS. 5A and 5B are cross-sectional views illustrating a process of forming a wire pattern.
Figure 5B:
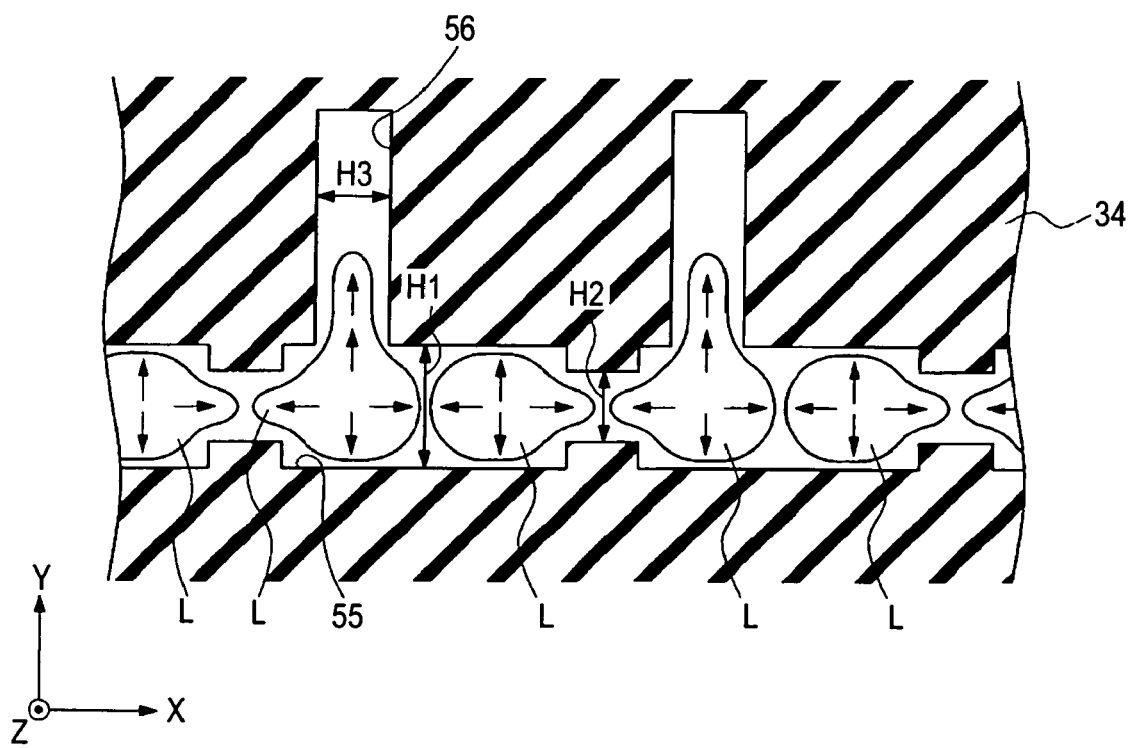

First, as shown in FIG. 4A, a bank material 34 is coated on the whole surface of the substrate 48 by using a spin coating method. The substrate 48 may be made of various materials such as glass, quartz glass, Si wafer, plastic film, and metal plate. In the embodiment, the bank material 34 employs an insulating material and/or a lyophilic material made of photosensitive acryl resin or polyimide. Accordingly, since the bank material 34 also has a function as a photo resist, the photo resist applying process can be omitted. When the first groove portion 55 and the second groove portion 56 are formed in the bank 34, the inner surface of the groove portions can be made to be lyophilic in advance. A base layer such as a semiconductor film, a metal film, a dielectric film, an organic film may be formed on the surface of the substrate 48. Various methods such as a spray coating method, a roll coating method, a die coating method, and a deep coating method may be used as the method of applying the bank material 34.

(Lyophobic Process)

Next, the surface of the bank material 34 applied to the whole surface of the substrate is subjected to a plasma process using a fluorine-containing gas such as $CF_4$, $SF_5$, and $CHF_3$. The surface of the bank material 34 can become lyophobic through the plasma process. A plasma processing method ($CF_4$ plasma processing method) using tetrafluoromethane as a processing gas in the atmosphere can be used as the lyophobic processing method. In the conditions of the $CF_4$ plasma process, the plasma power is in the range from 50 to 1000 W, the flow rate of 4-fluoride methane gas is in the range from 50 to 100 ml/min, the gas reaction speed with the plasma discharge electrode is in the range from 0.5 to 1020 mm/sec, and the gas temperature is in the range from 70 to 90° C. The process gas is not limited to the tetrafluoromethane (4-fluorocarbon), but may employ other fluorocarbon gas. The lyophobic process may be performed after forming a predetermined pattern of groove portions in the bank material 34.

For example, by using fluoro alkyl silane (FAS), a self organized film in which compounds are aligned such that fluoro alkyl groups are located on the film surface may be formed. In this case, a uniform lyophobic property is given to the surface of the bank material.

Examples of compounds constituting the self organized film can include fluoroalkylsilane (hereinafter, referred to as "FAS") such as heptadecafluoro-1,1,2,2 tetrahydrodecyltriethoxysilane, heptadecafluoro-1,1,2,2 tetrahydrodecyltrimethoxysilane, heptadecafluoro-1,1,2,2 tetrahydrodecyltrichlorosilane, tridecafluoro-1,1,2,2 tetrahydrooctyltriethoxysilane, tridecafluoro-1,1,2,2 tetrahydrooctyltrimethoxysilane, tridecafluoro-1,1,2,2 tetrahydrooctiltrichlorosilane, and trifluoropropyltrimethoxysilane. Such compounds may be individually used and combinations of two or more kinds thereof may be used. By using FAS, it is possible to obtain the excellent adhesive property to the substrate P and lyophobic property.

The self organized film made of an organic molecular film or the like is formed on the substrate by putting the raw compounds and the substrate into a closed vessel and leaving then alone at the room temperature for two or three days. It is a method of forming the film out of a gaseous material, but the self organized film may be formed out of a liquid material. For example, by immersing the substrate in a solution containing the raw compounds and then cleaning and drying the substrate, the self organized film is formed on the substrate P.

The lyophobic process may be performed using a micro contact printing method, after forming a predetermined pattern of groove portions in the bank material 34.

In this way, since the top surface of the bank material 34 is subjected to the lyophobic process, the functional liquid L placed on the top surface of the bank material 34 can be rebounded, thereby preventing the shortcircuit, disconnection, or the like of the wire pattern formed on the top surface.

Figure 4B:
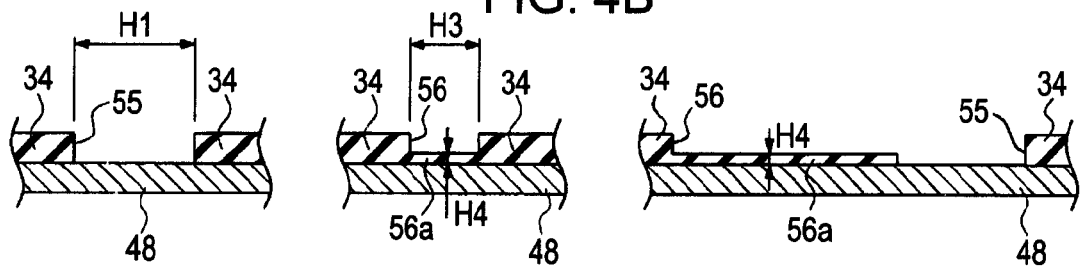

Next, as shown in FIG. 4B, the first groove portion 55 and the second groove portion 56 are formed in the bank material 34 applied to the whole surface of the substrate 48 through the photolithography process using the half-tone mask as a photo mask. Here, the half-tone mask is a photo mask having a region shielding the exposing light irradiated from an exposing apparatus, a region completely transmitting the exposing light, and a region partially transmitting the exposing light. The region of the photo mask partially transmitting the exposing light is provided with patterns such as diffraction lattices including slits, thereby controlling the intensity of the exposing light to be transmitted. The optical-chemical reaction used in the development of the photolithography process requires a positive-type resist.

First, as shown in FIG. 4B, the bank 34 corresponding to the first groove portion 55 is exposed to correspond to the region of the half-tone photo mask completely transmitting the exposing light. Accordingly, the exposing light can be irradiated to a first region (bank material) corresponding to the first groove portion 55 through the complete transmission.

At the same time, as shown in FIG. 4B, the bank 34 corresponding to the second groove portion 56 is exposed to correspond to the region of the half-tone photo mask partially transmitting the exposing light. Accordingly, since the exposing light irradiated to a second region (bank material) corresponding to the second groove portion 56 can be suppressed, the solubility of the bank material 34 due to the development can be reduced.

The bank 34 not corresponding to the first groove portion 55 and the second groove portion 56 is exposed to correspond to the region of the half-tone photo mask shielding the exposing light. Accordingly, the exposing light is not irradiated to the region and thus the bank 34 is not dissolved at the time of development.

Subsequently, the first groove portion 55 and the second groove portion 56 shown in FIG. 4B are formed by performing the development using the mask pattern. Here, as shown in FIG. 4B, the bottom raising portion 56a with the thickness H4 is formed on the bottom surface of the second groove portion 56 to be higher than the bottom surface of the first groove portion 55. On the other hand, the bottom surface of the first groove portion 55 does not have a predetermined thickness unlike the second groove portion 56 but the surface of the substrate 48 as the underlying layer is exposed.

By performing the half-tone exposure, as shown in FIG. 4B, the bottom raising portion 56a with the thickness H4 is formed on the bottom surface of the second groove portion 56, thereby making the bottom surface of the second groove portion 56 be higher than the bottom surface of the first groove portion 55. At this time, the first groove portion 55 and the second groove portion 56 have a lyophilic property, because the banks 34 are made of a lyophilic material as described above. The top surface of the bank 34 has a lyophobic property because it is not subjected to the lyophobic process.

(Residual Removing Process)

Next, in order to remove resist (organic substance) residuals at the time of forming the bank having the first groove portion 55 and the second groove portion 56, a residual removing process is performed to the substrate 48.

The residual removing process may employ various methods such as light etching with HF.

(Functional Liquid Placing Process)

Figure 4C:
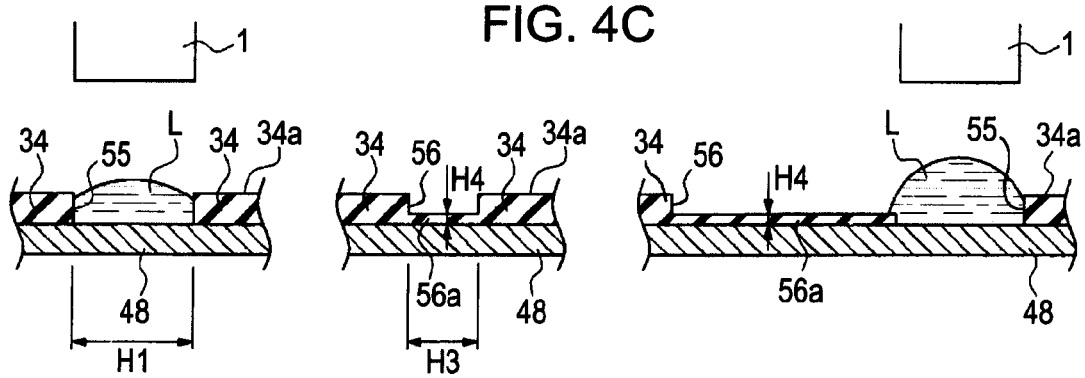

Next, as shown in FIGS. 4C and 5A, the functional liquid L which is a wire pattern forming material is provided in the first groove portion 55 by using the liquid droplet ejecting apparatus IJ. In the embodiment, since the second groove portion as the second region is a micro wire pattern, the width H3 of the second groove portion 56 formed in the bank material 34 is small and thus it is difficult to directly provide the functional liquid L with the liquid droplet ejecting apparatus IJ. Therefore, the placement of the functional liquid L in the second groove portion 56 is performed using a method of allowing the functional liquid L placed in the first groove portion 55 to flow in the second groove portion 56 with the capillary phenomenon as described above.

The functional liquid L placed in the first groove portion 55 by the liquid droplet ejecting apparatus IJ is wet-diffused inside the first groove portion 55 as shown in FIGS. 4C and 5A. Here, it is preferable that a part of the functional liquid L is placed in the intersection between the first groove portion 55 and the second groove portion 56. As a result, since the functional liquid L can be placed in the vicinity of the inflow port of the second groove portion 56, the functional liquid L can be allowed to smoothly flow in the second groove portion 56 by using the capillary phenomenon. Specifically, as shown in FIG. 5B, the functional liquid L is wet-diffused toward the width H2 of the first groove portion 55 smaller than the width H1 of the first groove portion 55 and toward the width H3 of the second groove portion 56 by using the capillary phenomenon. Accordingly, the functional liquid L is not ejected directly to the second groove portion 56 but is allowed to flow in the second groove portion 56, thereby placing the functional liquid L in the second groove portion. Through the process, the wire pattern 40 (first pattern) is formed in the first groove portion 55 and the wire pattern 41 (second pattern) is formed in the second groove portion.

(Intermediate Dry Process)

Next, after placing the functional liquid L in the first groove portion 55 and the second groove portion 56 and then forming the wire pattern 40 and 41, a dry process is performed as needed. As a result, the dispersion medium of the functional liquid L is removed, thereby securing the thickness of the wire pattern 40 and 41. The dry process can be performed using various methods such as a hot plate, an electric furnace, a lamp anneal, or the like for heating the substrate 48. The light source used for the lamp annealing is not particularly limited. An infrared lamp, a xenon lamp, a YAG laser, an argon laser, a carbon gas laser, and an excimer laser of XeF, XeCl, XeBr, KrF, KrCl, ArF, ArCl or the like can be used as the light source. The light sources generally have power ranging 10 W to 5000 W. In the embodiment, the light source having power ranging 100 W to 1000 W is enough.

(Baking Process)

Next, when the conductive material of the functional liquid L is, for example, organic silver compound, it is necessary to perform heat treatment, to remove the organic components of the organic silver compounds, and to allow the silver particles to remain, so as to obtain conductivity. As a result, it is preferable that heat treatment and/or light treatment is performed to the substrate on which the functional liquid L has been placed. Generally, the heat treatment and/or the light treatment is performed in the atmosphere, but may be performed in an inert gas atmosphere of nitrogen, argon, helium, or the like as needed. The process temperature of the heat and/or light treatment is properly determined in consideration of the boiling point (vapor pressure) of the dispersion medium, the kinds or pressure of the atmosphere gas, the thermal behavior such as a dispersion property or an oxidation property of the particles or the organic silver compound, the amount of coating agent, the heat-proof temperature of a base material, and the like. For example, in order to remove the organic components from the organic silver compound, it is necessary to perform the baking process at a temperature of 200° C. When a plastic substrate is used, it is preferable that the baking process is performed at a temperature higher than the room temperature and lower than 100° C.

Figure 4D:
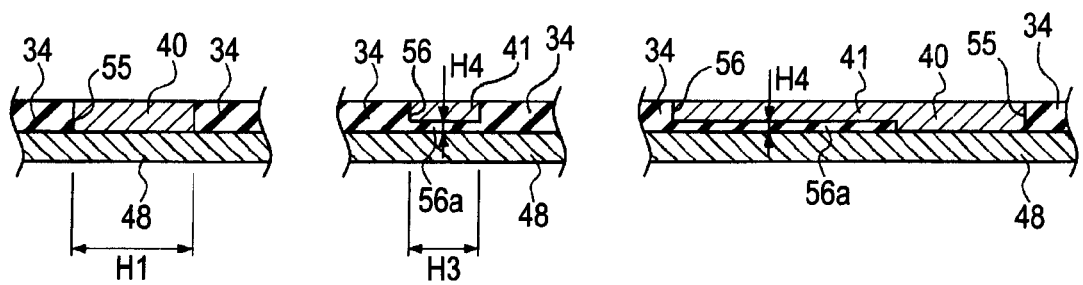

Through the above-mentioned processes, the silver particles are allowed to remain in the functional liquid L, thereby obtaining a conductive film. Accordingly, as shown in FIG. 4D, it is possible to form a conductive pattern as a continuous film, that is, the wire patterns 40 and 41.

Conventionally, when the wire pattern 41 which is a micro pattern is formed using the capillary phenomenon, the wire pattern 41 formed using the capillary phenomenon became thinner than other wire patterns 40. On the contrary, according to the embodiment of the invention, as shown in FIG. 4D, the bottom raising portion 56a having a thickness H4 is formed on the bottom surface of the second groove portion 56. As a result, the functional liquid L placed in the second groove portion 56 is positioned on the bottom higher than that of the functional liquid L placed in the first groove portion 55. Therefore, the height of the wire pattern 40 formed in the first groove portion 55 and the height of the wire pattern 41 formed in the second groove portion 56 can be made to be equal. As a result, since a flat region can be formed on the wire pattern 40 formed in the first groove portion 55 and the wire pattern 41 formed in the second groove portion 56, it is possible to prevent the shortcircuit, disconnection, or the like of the wire patterns.

Next, pixels formed using the bank structure according to the embodiment described above and a pixel forming method will be described with reference to FIGS. 6 to 8.

(Structure of Pixel)

Figure 6:
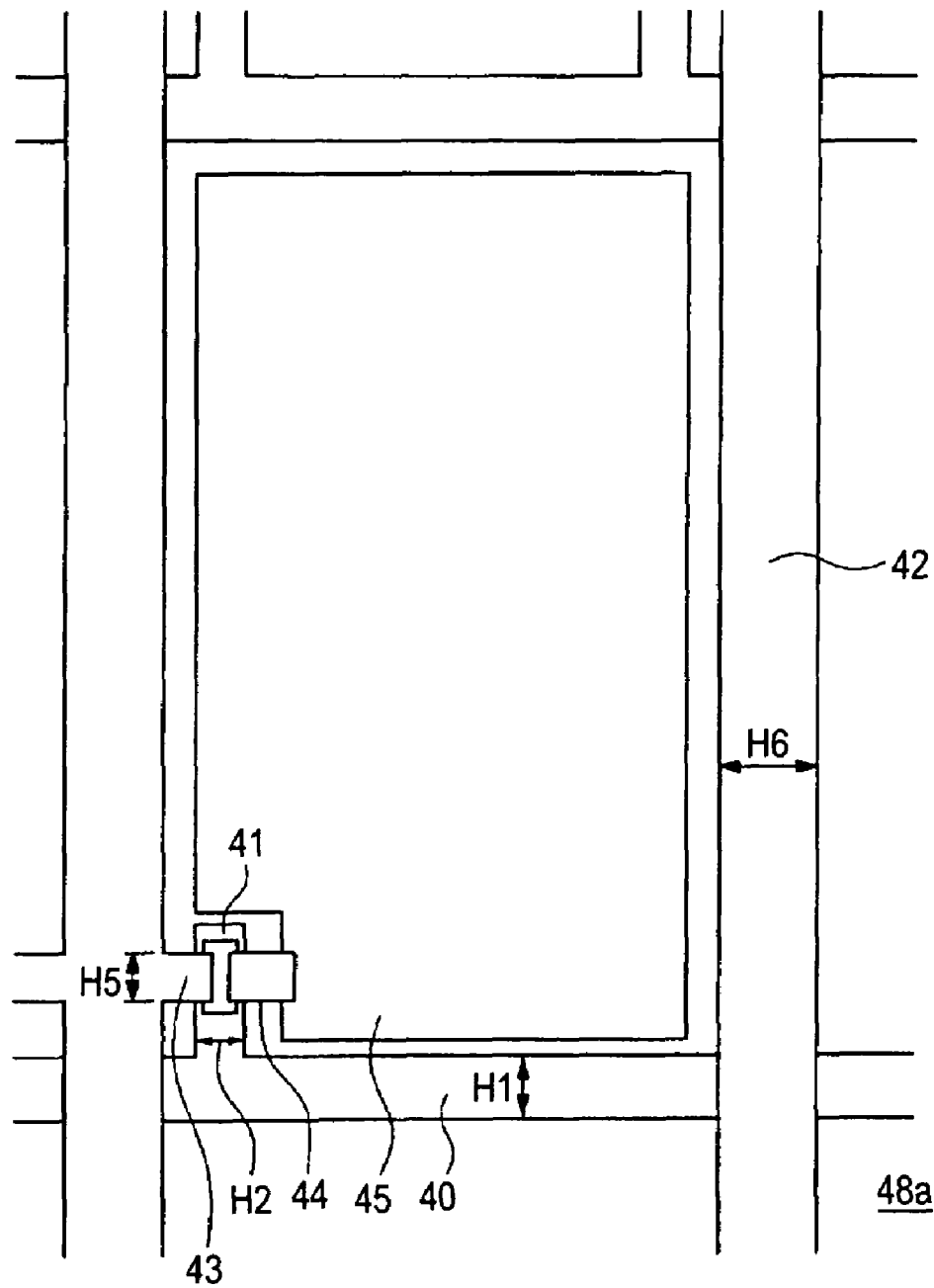
FIG. 6 is a plan view schematically illustrating one pixel in a display area.

FIG. 6 is a diagram illustrating a structure of a pixel according to the embodiment.

As shown in FIG. 6, a pixel includes on the substrate substrate 48a: a gate wire 40 (first pattern); a gate electrode 41 (second pattern) extending from the gate wire 40; a source wire 42 (first pattern); a source electrode 43 (second pattern) extending from the source wire 42; a drain electrode 44; and a pixel electrode 45 electrically connected to the drain electrode 44. The gate wire 40 extends in the X axis direction and the source wire 42 extends in the Y axis direction crossing the gate wire 40. A TFT as a switching element is formed in the vicinity of the intersection between the gate wire 40 and the source wire 42. By turning on the TFT, driving current is supplied to the pixel electrode 45 connected to the TFT.

Here, as shown in FIG. 6, the width H3 of the gate electrode 41 is smaller than the width H1 of the gate wire 40. For example, the width H3 of the gate electrode 41 is 10 µm and the width H1 of the gate wire 40 is 20 µm. The width H5 of the source electrode 43 is smaller than the width H6 of the source wire 42. For example, the width H5 of the source electrode 43 is 10 µm and the width H6 of the source wire 42 is 20 µm. As a result, even in the case of a micro pattern (the gate electrode 41 and the source electrode 43) to which the functional liquid L cannot be directly placed, it is possible to allow the functional liquid L to flow in the micro pattern by using the capillary phenomenon.

(Pixel Forming Method)

FIGS. 7A to 7E are cross-sectional views illustrating a process of forming a pixel according to the embodiment.

In the embodiment, the gate electrode, the source electrode, and the drain electrode of a bottom-gate TFT 30 is formed using the bank structure and the pattern forming method described above. In the following description, since the same processes as the pattern forming method shown in FIGS. 4A to 4D and FIGS. 5A and 5B are performed, description thereof will be omitted. The wire pattern 41 formed in the above-mentioned method is the gate electrode in the pixel forming method described below. Like elements described in the embodiment described above are denoted by like reference numerals.

Figure 7A:
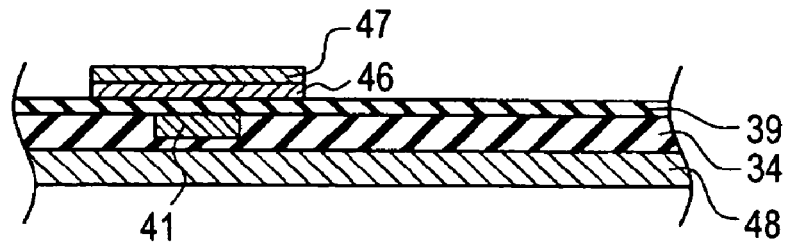
FIG. 7 is a cross-sectional view illustrating a process of forming one pixel.

As shown in FIG. 7A, a gate insulating film 39 is formed on the flat surface of the banks including the wire pattern formed through the processes shown in FIGS. 4A to 4D. Here, The gate insulating film 39 is made of silicon nitride. Next, an active layer is formed on the gate insulating film 39. Subsequently, as shown in FIG. 7A, by patterning the active layer in a predetermined shape through a photolithography process and an etching process, an amorphous silicon film 46 is formed.

Next, a contact layer 47 is formed on the amorphous silicon film 46. Subsequently, as shown in FIG. 7A, the contact layer 47 is patterned in a predetermined shape through a photolithography process and an etching process. The contact layer 47 is formed out of an n+ silicon film by varying the material gas or the plasma condition.

Figure 7B:
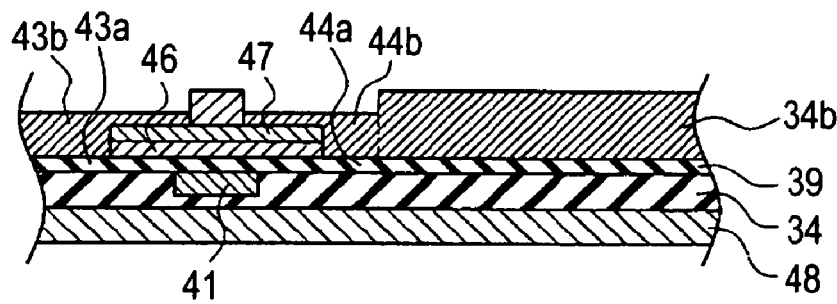

Next, as shown in FIG. 7B, the bank material is coated on the whole surface including the contact layer 47 by using a spin coating method. Here, the bank material is made of polymethylsilazane as a transparent material and contains a photosensitive material and/or a lyophilic material. Subsequently, a $CF_4$ plasma process (a plasma process using a gas having a fluorine component) is performed so as to give a lyophobic property to the surface of the coated bank material. It is preferable that the contact angle of the bank material having the lyophobic property about the functional liquid L is 40° or more.

Next, a bank 34b for source/drain electrodes with 1/20 to 1/10 of a pixel pitch is formed. Specifically, first, a source-electrode groove portion 43a is formed at the position corresponding to the source electrode 43 in the bank material coated on the gate insulating film 39 by means of a photolithography process and a drain-electrode groove portion 44a is formed at the position corresponding to the drain electrode 44. At this time, similar to the pattern forming method described above, by using the half-tone mask as the photo mask, a bottom raising portion 43b for the source electrode is formed on the bottom surface of the source-electrode groove portion 43a as shown in FIG. 7B. Specifically, at the time of the photolithography process, the region of the photo mask partially transmitting the exposing light is allowed to correspond to the region corresponding to the source electrode 43 and then the exposure and development processes are performed. Similarly, a bottom raising portion 44b for the drain electrode is formed on the bottom surface of the drain-electrode groove portion 44a.

Figure 7C:
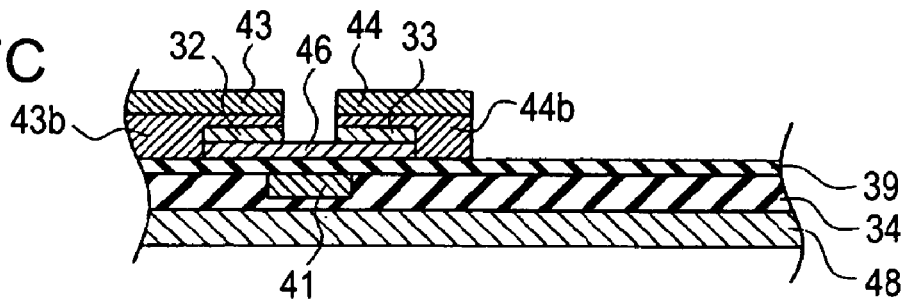

Subsequently, the functional liquid L is placed in the source-wire groove portion by using the liquid droplet ejecting apparatus IJ (not shown). Here, the width H5 of the source-electrode groove portion 43a is smaller than the width H6 of the source-wire groove portion. As a result, the functional liquid L placed in the source-wire groove portion flows in the source-electrode groove portion 43a. Accordingly, as shown in FIG. 7C, the source electrode 43 is formed. Similarly, the drain electrode 44 is formed.

In this way, by using the pattern forming method according to the embodiment, it is possible to form the source wire 42 and the source electrode 43 with the same height, thereby forming a flat region thereon. As a result, even when a predetermined pattern is formed on the flat region, it is possible to prevent the shortcircuit, disconnection, or the like of a pattern due to the step difference. Since the source/drain-electrode banks 34 are subjected to the lyophobic process and the inner surfaces of the source-electrode groove portion 43a and the drain-electrode groove portion 44a are lyophilic, the functional liquid L is not leaked from the groove portions, thereby enabling the formation of a micro wire pattern.

Next, as shown in FIG. 7C, after forming the source electrode 43 and the drain electrode 44, the source/drain-electrode banks 34b are removed. Then, by using the source electrode 43 and the drain electrode 44 remaining on the contact layer 47 as a mask, the n+ silicon film of the contact layer 47 interposed between the source electrode 43 and the drain electrode 44 is etched. Through the etching process, the N+ silicon film of the contact layer 47 interposed between the source electrode 43 and the drain electrode 44 is removed and thus a part of the amorphous silicon film 46 is exposed. In this way, a source region 32 made of N+ silicon is formed below the source electrode 43 and a drain region 33 made of N+ silicon is formed below the drain electrode 44. A channel region (amorphous silicon film 46) made of amorphous silicon is formed below the source region 32 and the drain region 33.

The bottom-gate TFT 30 is formed through the processes described above.

Figure 7D:
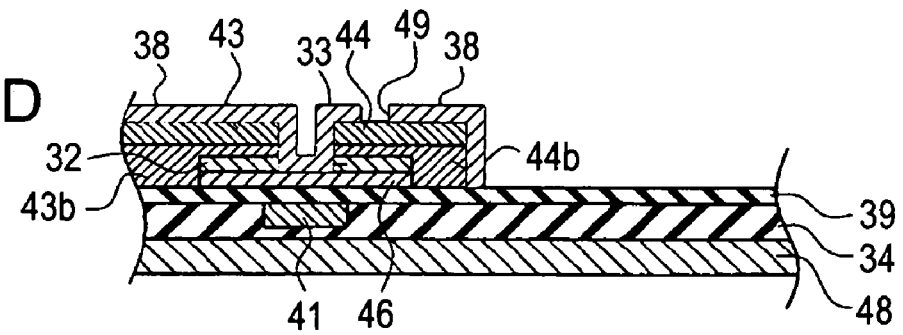

Next, as shown in FIG. 7D, a passivation film 38 (protective film) is formed on the source electrode 43, the drain electrode 44, the source region 32, the drain region 33, and the exposed silicon layer by using a vapor deposition method or a sputtering method. Subsequently, by means of a photolithography process and an etching process, the passivation film 38 on the gate insulating film 39 in which the pixel electrode 45 would be formed is removed. At the same time, a contact hole 49 is formed in the passivation film 38 on the drain electrode 44 so as to electrically connect the pixel electrode 45 and the source electrode 43.

Figure 7E:
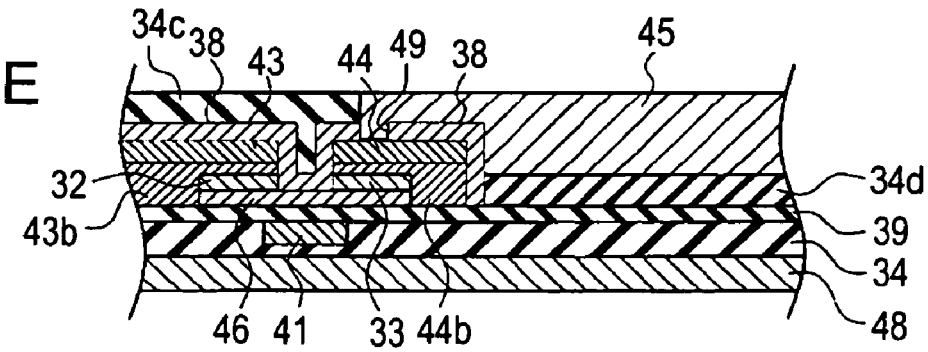

Next, as shown in FIG. 7E, a bank material is applied to the region including the gate insulating film 39 in which the pixel electrode 45 would be formed. Here, the bank material contains the photosensitive material and/or lyophilic material as described above. Subsequently, the lyophobic process such as a plasma process is performed to the top surface of the bank material (pixel-electrode bank 34c). Next, by means of a photolithography process using a half-tone mask as a photo mask, a pixel-electrode groove portion is formed in the area where the pixel electrode 45 would be formed and then the pixel-electrode bank 34c is formed therein. At this time, a bottom raising portion 34d for the pixel electrode is formed in the pixel-electrode groove portion.

Here, the reason for forming the bottom raising portion 34d for the pixel electrode will be described.

The TFT 30 which is a switching element has a predetermined thickness of, for example, 3000 Å. On the other hand, the pixel electrode is formed within a range of thickness of 1500 to 2000 Å. Therefore, the pixel electrode 45 is thinner than the TFT 30. As a result, a step difference is generated between the top surface of the TFT 30 and the top surface of the pixel electrode formed adjacent to the TFT and thus the shortcircuit, disconnection, or the like can occur in the wires formed on the top surfaces. Therefore, in order to solve such a problem, the bottom raising portion 34d for raising the bottom surface of the pixel electrode 45 is formed in the embodiment. As a result, the top surface including the TFT 30 and the pixel electrode can be flat. Even when a predetermined pattern is further stacked on the flat surface, it is possible to prevent the shortcircuit, disconnection, or the like of the pattern due to the step difference. Since the pixel-electrode bank 34c and the bottom raising portion 34d for the pixel electrode are made of polymethylsilazane which is a transparent material, the permeability is 90% or more. Therefore, the bottom raising portion 34*d* formed below the pixel electrode 45 does not shield the light irradiated from a backlight but can transmit the light.

Next, the pixel electrode 45 made of ITO (Indium Tin Oxide) is formed in the area partitioned by the pixel-electrode bank 34*c* by using a vapor deposition method or an inkjet method. By filling the contact hole 49 with the pixel electrode 45, the pixel electrode 45 and the drain electrode 44 are electrically connected. In the present embodiment, the lyophobic process is performed to the top surface of the pixel-electrode bank 34*c* and the lyophilic process is performed to the top surface of the bottom raising portion 34*d* for the pixel electrode. As a result, the pixel electrode 45 can be formed without departing from the pixel-electrode groove portion. As shown in FIG. 7E, since the pixel electrode 45 is formed on the bottom raising portion 34*d* having a predetermined thickness, the height of the TFT and the height of the pixel electrode 45 made of ITO can be made equal, thereby forming the flat area on the pixel-electrode bank 34*c* and the pixel electrode 45 without the step difference. Consequently, even when a predetermined pattern is further formed on the flat area, it is possible to prevent the shortcircuit, disconnection, or the like of the pattern due to the step difference.

Through the processes described hitherto, the pixel according to the embodiment shown in FIG. 6 can be formed.

Second Embodiment

Next, the bank structure and the pattern forming method according to the second embodiment will be described in detail with reference to FIG. 8.

In the first embodiment, by forming the bank material 34 out of a material containing photosensitive resin and directly exposing and developing the bank material 34, a predetermined pattern of groove portions were formed. On the contrary, the second embodiment is different from the first embodiment, in that the bank material 34 is formed out of a material not containing the photosensitive resin. The other basic constructions of the bank structure and the pattern forming method are similar to those of the first embodiment. Like elements are denoted by like reference numerals and description thereof will be omitted.

FIGS. 8A to 8E are cross-sectional views illustrating the pattern forming method with the bank structure in the order of processes, which are taken along Line A-A' of FIG. 3.

Figure 8A:
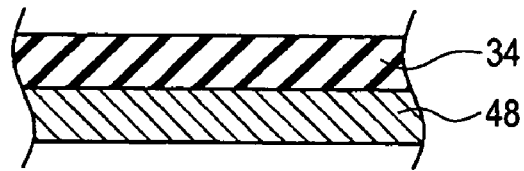
FIG. 8 is a cross-sectional view illustrating a process of forming a wire pattern according to another embodiment.

First, as shown in FIG. 8A, the bank material 34 is coated on the whole surface of the substrate 48 by using a spin coating method. Next, the surface of the bank material 34 coated on the whole surface of the substrate 48 is processed in plasma by using a fluorine-containing gas such as $CF_4$, $SF_6$, and $CHF_3$ as a process gas, thereby giving a lyophobic property to the surface of the bank material 34.

Figure 8B:
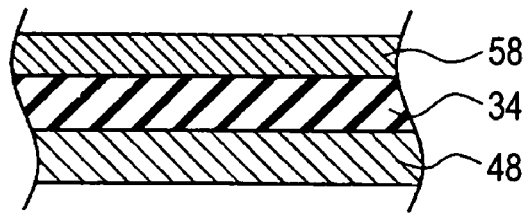
Figure 8C:
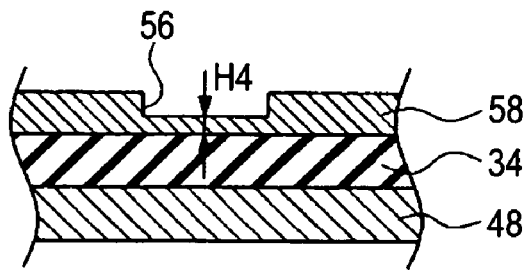

Next, as shown in FIG. 8B, a photo resist 58 is applied onto the bank material 34 having been subjected to the lyophobic process. Subsequently, the photo resist 58 applied onto the bank material 34 is patterned in a predetermined shape. Specifically, the photo resist 58 in the area corresponding to the second groove portion 56 is exposed and developed by using a half-tone mask as a photo mask. As a result, as shown in FIG. 8C, the groove portion with a predetermined thickness H4 is formed in the area corresponding to the second groove portion 56 of the photo resist 58 exposed and developed.

Figure 8D:
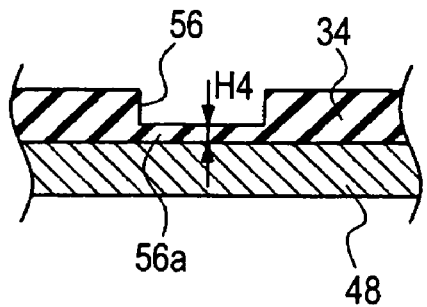

Next, as shown in FIG. 8D, the bank material 34 is etched by using the photo resist 58 exposed and developed as a mask. Various etching methods such as wet etching, dry etching, or the like can be used as the etching method. By performing the etching with the photo resist 58 as a mask, the second groove portion 56 having the bottom raising portion 56*a* with a predetermined thickness H4 is formed in the bank material 34. In the second embodiment, by forming the bottom raising portion 56*a* with a predetermined thickness H4 on the bottom surface of the second groove portion 56, the bottom surface of the second groove portion 56 can be made to be higher than the bottom surface of the first groove portion.

Next, in order to remove resist (organic substances) residuals at the time of forming the bank with the second groove portion 56, a residual removing process is performed to the substrate 48.

Figure 8E:
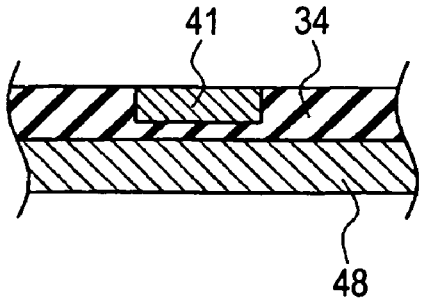

Next, as shown in FIG. 8E, the functional liquid L is placed in the first groove portion 55 by the liquid droplet ejecting apparatus IJ (not shown). As shown in FIG. 8E, the functional liquid L placed in the first groove portion 55 by the liquid droplet ejecting apparatus IJ flows in the second groove portion 56 with the capillary phenomenon, thereby forming the wire pattern 41 in the second groove portion.

Through the processes described hitherto, the wire pattern 40 (not shown) is formed in the first groove portion 55 and the wire pattern 41 is formed in the second groove portion 56, as shown in FIG. 8E.

According to the second embodiment, similar to the first embodiment, since the height of the bottom surface of the second groove portion 56 is greater than the height of the bottom surface of the first groove portion 55, the thickness of the pattern formed in the first groove portion 55 and the thickness of the pattern formed in the second groove portion 56 can be made to be equal. As a result, the step difference among the pattern formed in the second groove portion 56, the pattern formed in the first groove portion 55, and the bank can be prevented and thus the shortcircuit, disconnection, or the like of the pattern stacked on the bank including the patterns can be prevented.

(Electro-Optical Device)

Next, a liquid crystal display device as an example of the electro-optical device according to the invention having pixels formed using the pattern forming method with the bank structure will be described.

Figure 9:
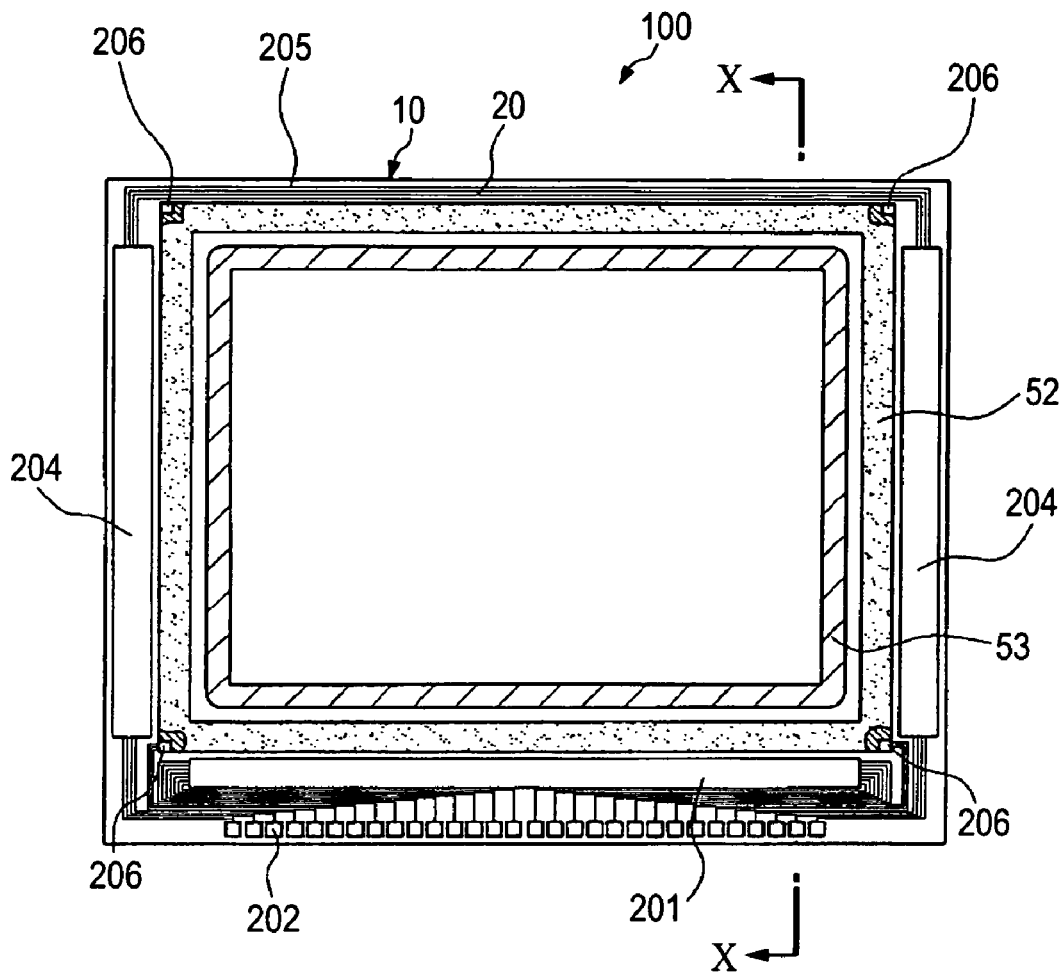
FIG. 9 is a plan view of a liquid crystal display device as seen from a counter substrate.
Figure 10:
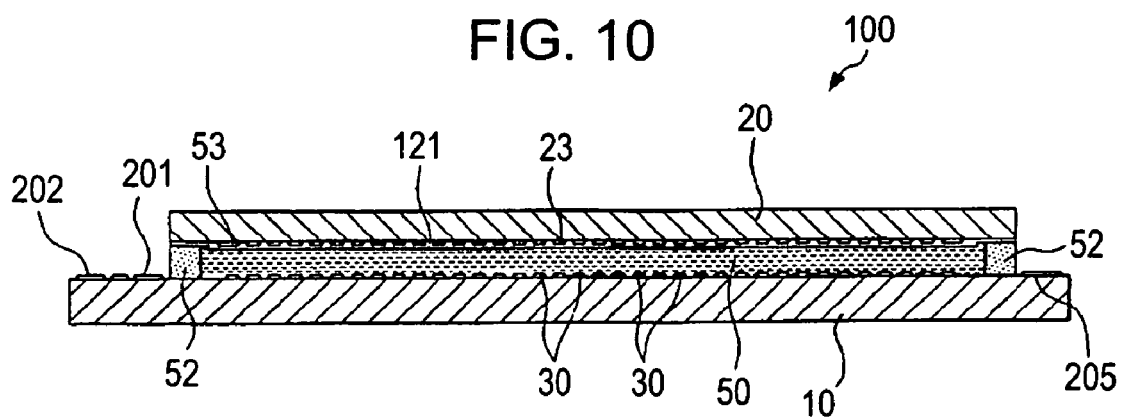
FIG. 10 is a cross-sectional view of the liquid crystal display device taken along Line H-H' of FIG. 9.
Figure 11:
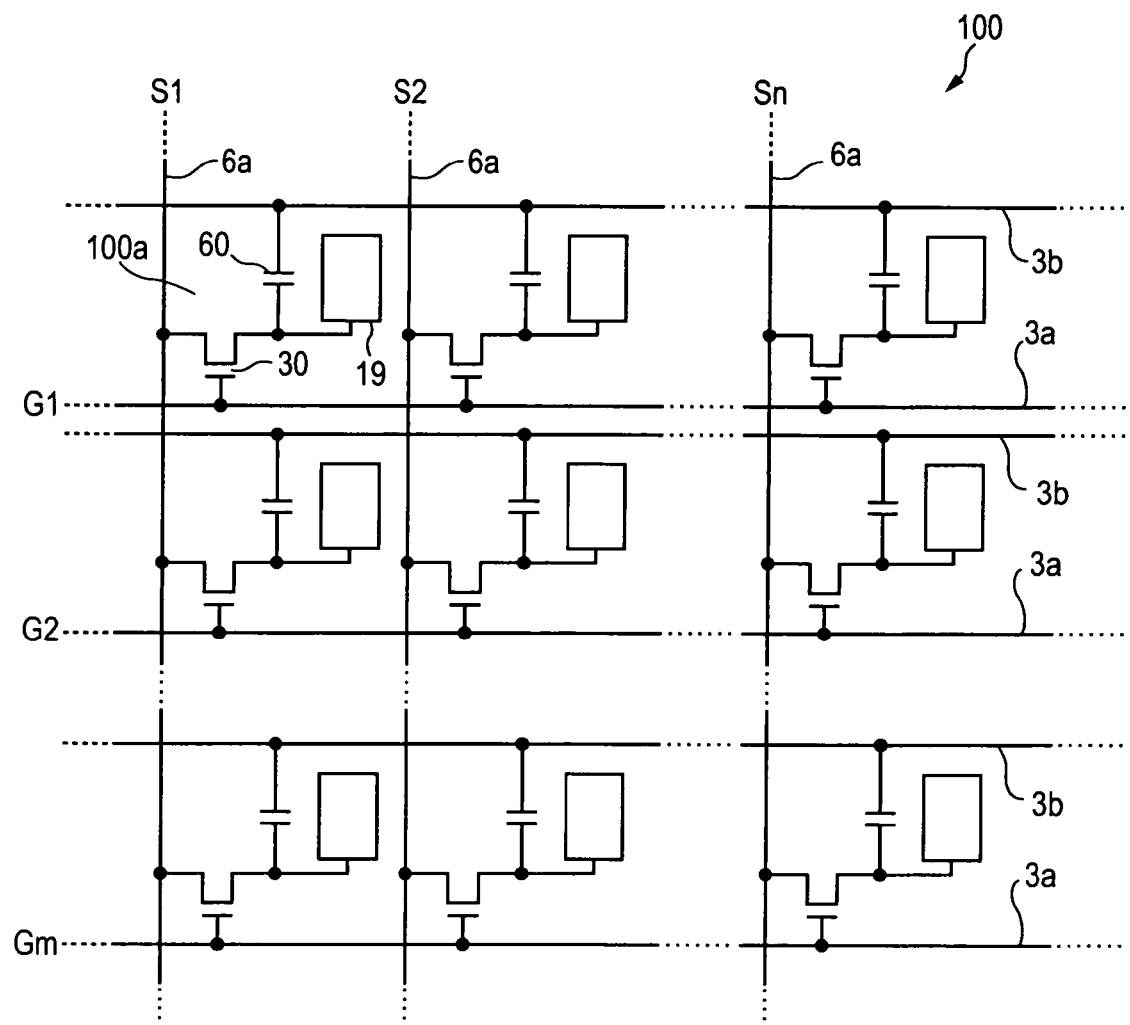
FIG. 11 is an equivalent circuit diagram illustrating the liquid crystal display device.

FIG. 9 is a plan view of the liquid crystal display device according to the invention as shown from a counter substrate, where elements thereof are shown. FIG. 10 is a cross-sectional view taken along Line H-H' of FIG. 9. FIG. 11 is an equivalent circuit diagram illustrating the liquid crystal display device including elements and wires in a plurality of pixels which is formed in a matrix shape in an image display area of the liquid crystal display device. In the figures used in the following description, in order to sufficiently recognize the layers and elements, the scales of the layers and elements are difference.

In FIGS. 9 and 10, the liquid crystal display device (electro-optical device) 100 according to the second embodiment has a TFT array substrate 10 and a counter substrate 20 which are bonded to each other with a sealing member 52 as a photo-curing enclosing material. The liquid crystal 50 is injected and held in the area partitioned by the sealing member 52. The sealing member 52 is formed in a closed frame shape on the substrate and has no sealing trace without a liquid crystal injection port.

A peripheral partitioning portion 53 made of a light-shielding material is formed inside the sealing member 52. A data-line driving circuit 201 and mounting terminals 202 are formed along one side of the TFT array substrate 10 outside the sealing member 52 and scanning-line driving circuits 204 are formed along two sides adjacent to the one side. A plurality of wires 205 for connecting the scanning-line driving circuits 204 provided at both sides of the image display area are provided along the other side of the TFT array substrate 10. An inter-substrate electrical connection member 206 for electrically connecting the TFT array substrate 10 and the counter substrate 20 is disposed in at least one corner of the counter substrate 20.

Instead of forming the data-line driving circuit 201 and the scanning-line driving circuits 204 on the TFT array substrate 10, terminal groups formed in the peripheral portions of a TAB (Tape Automated Bonding) substrate mounted with a driving LSI and the TFT array substrate 10 may be electrically and mechanically connected through an anisotropic conductive film. In the liquid crystal display device 100, a retardation film, a polarizing film, and the like are arranged in a predetermined direction in accordance with the kinds of the liquid crystal 50 to be used, that is, operation modes such as TN (Twisted Nematic) mode, C-TN mode, VA mode, and IPS mode, or normally-white mode/normally-black mode, but are not shown.

When the liquid crystal display device 100 is formed for color display, color filters of red (R), green (G), and blue (B) along with protective films thereof are formed in the areas on the counter substrate 20 opposed to the pixel electrodes on the TFT array substrate 10.

In the image display area of the liquid crystal display device 100, as shown in FIG. 10, a plurality of pixels 100a are formed in a matrix shape and a pixel-switching TFT (switching element) 30 is formed in each pixel 100a. A data line 6a for supplying pixel signals S1, S2, . . . , Sn is electrically connected to the source of the TFT 30. The pixel signals S1, S2, . . . , Sn to be written to the data line 6a may be supplied line-sequentially in that order and may be supplied to a plurality of data lines 6a adjacent to each other in a unit of groups. A scanning line 3a is electrically connected to the gate of the TFT 30. At a predetermined time point, scanning signals G1, G2, . . . , Gn are pulse-like supplied line-sequentially to the scanning line 3a in that order.

The pixel electrode 19 is electrically connected to the drain of the TFT 30. By turning on the TFT 30 as a switching element only for a predetermined period of time, the pixel signals S1, S2, . . . , Sn supplied from the data line 6a are written to the pixels at a predetermined time point. In this way, the pixel signals S1, S2, . . . , Sn with a predetermined level written to liquid crystal through the pixel electrodes 19 are held between a counter electrode 121 of the counter substrate 20 shown in FIG. 10 and the pixel electrode for a predetermined period of time. In order to prevent the held pixel signals S1, S2, . . . , Sn from being leaked, a storage capacitor 60 is provided in parallel to a liquid crystal capacitor formed between the pixel electrode 19 and the counter electrode 121. For example, the voltage of the pixel electrode 19 is held by the storage capacitor 60 for a period of time longer by three digits than the time for applying the source voltage. Accordingly, the charge holding characteristic can be improved, thereby embodying the liquid crystal display device 100 having a high contrast ratio.

Figure 12:
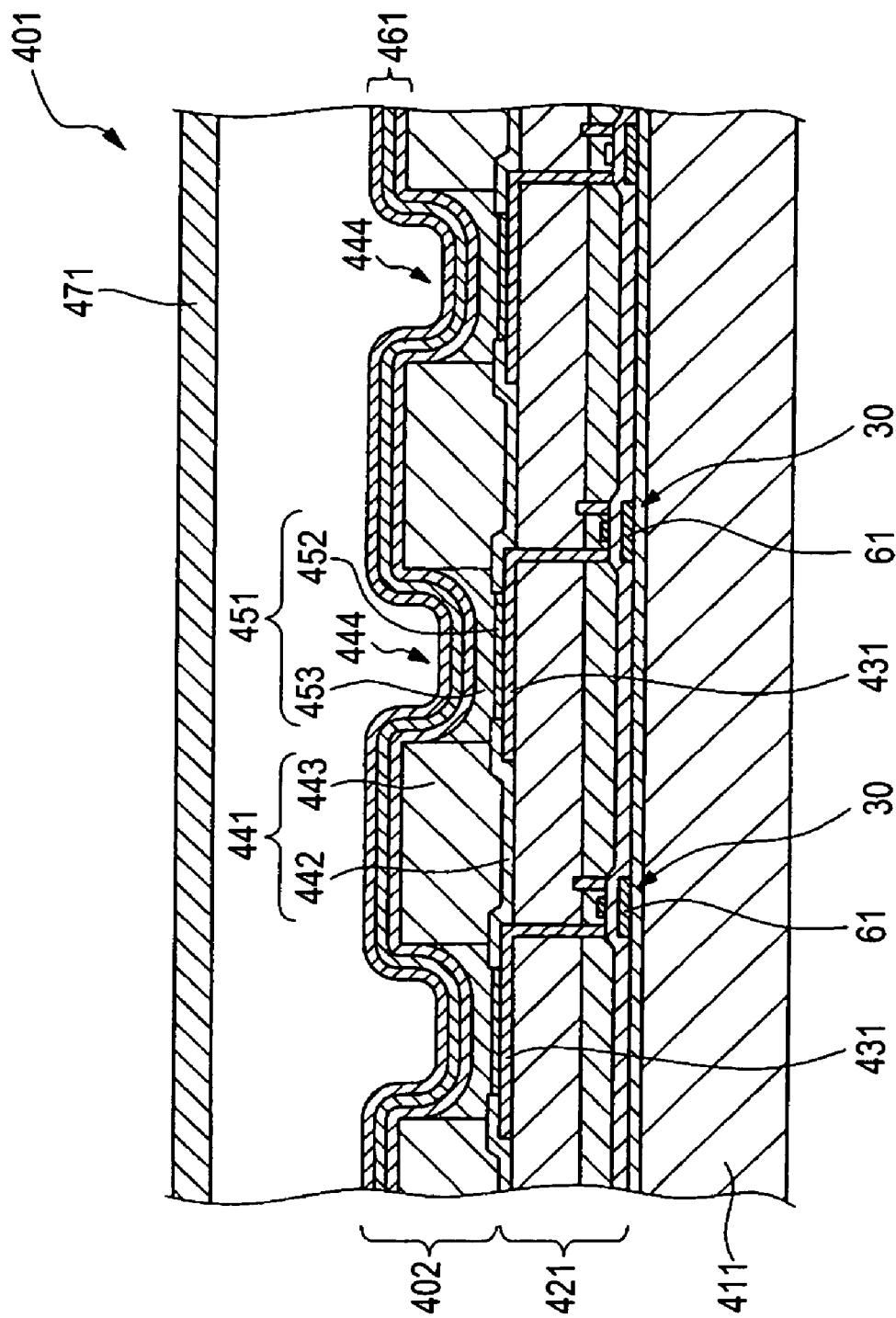
FIG. 12 is a partially-enlarged cross-sectional view of an organic electroluminescence display device.

FIG. 12 is a side cross-sectional view of an organic EL display device having pixels formed using the bank structure and the pattern forming method. Hereinafter, a schematic structure of the organic EL display device will be described with reference to FIG. 12.

As shown in FIG. 12, in the organic EL display device 401, an organic EL element 402 having a substrate 411, a circuit element section 421, a pixel electrode 431, a bank section 441 including a bank 442 for the hole injecting layer and a bank 443 for the light-emitting layer, a light-emitting element 451, a cathode 461 (counter electrode), and a sealing substrate 471 is connected to wires and a driving IC (not shown) of a flexible substrate (not shown). The circuit element section 421 is formed by forming TFT 60 as an active element on the substrate 411 and arranging a plurality of pixel electrodes 431 on the circuit element section 421. The gate wires 61 constituting the TFTs 60 are formed by using the wire pattern forming method according to the embodiments.

Bank portions 441 are formed in a lattice shape between the pixel electrodes 431 and the light-emitting elements 451 are formed in concave openings 444 formed by the bank portions 441. The light-emitting elements 451 include elements emitting red light, elements emitting green light, and elements emitting blue light, whereby the organic EL display device 401 can embody the full color display. The cathode 461 is formed on the whole surface of the bank portions 441 and the light-emitting elements 451 and the sealing substrate 471 is stacked on the cathode 461.

The method of manufacturing the organic EL display device 401 including the organic EL elements includes a bank portion forming step of forming the bank portions 441, a plasma processing step for properly forming the light-emitting elements 451, a light-emitting element forming step of forming the light emitting elements 451, a counter electrode forming step of forming the cathode 461, and a sealing step of stacking and sealing the sealing substrate 471 on the cathode 461.

In the light-emitting element forming step, the light-emitting elements 451 are formed by forming a hole injecting layer 452 and a light-emitting layer 453 in the concave opening portions 444, that is, on the pixel electrodes 431. The light-emitting element forming step includes a hole injecting layer forming step and a light-emitting layer forming step. The hole injecting layer forming step has a first ejecting step of ejecting a liquid material for the hole injecting layer 452 onto the pixel electrodes 431 and a first dry step of drying the ejected liquid material to form the hole injecting layer 452. The light-emitting layer forming step has a second ejecting step of ejecting a liquid material for the light-emitting layer 453 onto the hole injecting layer 452 and a second dry process of drying the ejected liquid material to form the light-emitting layer 453. Three kinds of light-emitting layers 453 are formed out of materials corresponding to three colors of red, green, and blue as described above. Therefore, the second ejecting step includes three steps for ejecting three kinds of materials, respectively.

In the light-emitting layer forming step, the liquid droplet ejecting apparatus IJ can be used in the first ejecting step of the hole injecting layer forming step and the second ejecting step of the light-emitting layer forming step.

The device (electro-optical device) according to the invention can be applied to a PDP (Plasma Display Panel) or a surface-conducting electron emission device utilizing a phenomenon that electrons are emitted by applying current to a thin film with a small area formed on a substrate in parallel to the film surface.

(Electronic Apparatus)

Next, a specific example of an electronic apparatus according to the invention will be described.

Figure 13:
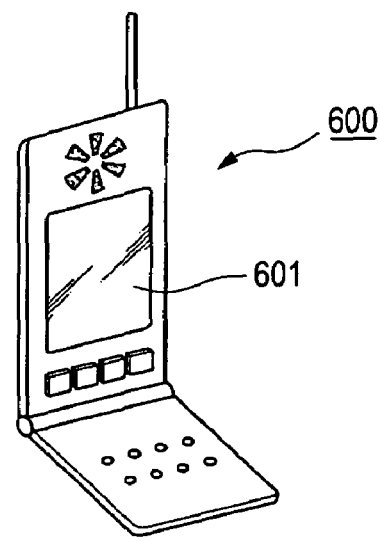
FIG. 13 is a diagram illustrating a specific example of an electronic apparatus according to the invention.

FIG. 13 is a perspective view illustrating an example of a cellular phone. In FIG. 13, reference numeral 600 denotes a cellular phone body and reference numeral 601 denotes a liquid crystal display unit having the liquid crystal display device 100 according to the above-mentioned embodiment.

Since the electronic apparatus shown in FIG. 13 has the liquid crystal display device formed using the pattern forming method with the bank structure according to the above-mentioned embodiment, it is possible to obtain high quality and performance.

Although the electronic apparatus according to the embodiment has a liquid crystal display device, the electronic apparatus may have another electro-optical device such as an organic electroluminescence display device, a plasma display device, and the like.

Next, an example where the pattern formed using the pattern forming method with the bank structure according to the invention is applied to an antenna circuit will be described.

Figure 14:
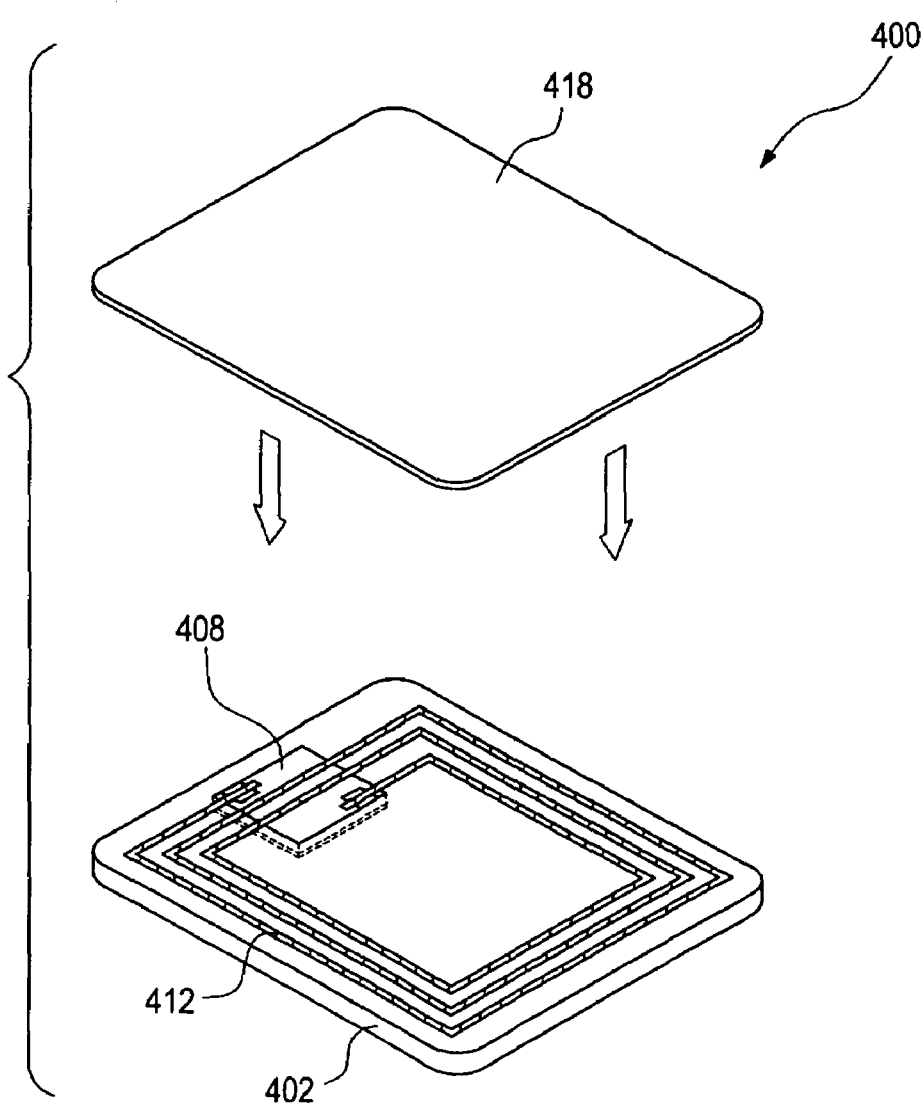
FIG. 14 is an exploded perspective view of a non-contact card medium.

FIG. 14 shows a non-contact card medium according to the embodiment. The non-contact card medium 400 has a semiconductor integrated circuit chip 408 and an antenna circuit 412 built in a case including a card body 402 and a card cover 410 and performs at least one of power supply and data transmission and reception by at least one of electromagnetic coupling and electrostatic capacitive coupling to an external transceiver not shown.

In the embodiment, the antenna circuit 412 is formed using the pattern forming method according to the present invention. As a result, decrease in size and width of the antenna circuit 412 can be accomplished and thus it is possible to obtain high quality and performance.

The present invention can be applied to various types of electronic apparatuses, in addition to the above-mentioned electronic apparatus. The invention can be applied to electronic apparatuses such as a liquid crystal projector, a multimedia personal computer (PC), an engineering and work station (EWS), a pager, a word processor, a television, a view finder type or monitor direct view type video tape recorder, an electronic pocket book, an electronic desktop calculator, a car-navigation apparatus, a POS terminal, an apparatus having a touch panel, and the like.

Although the exemplary embodiments of the invention have been hitherto described with reference to the accompanying drawings, the invention is not limited to the exemplary embodiments. The shapes or combinations of the elements shown in the exemplary embodiments are only examples and can be variously changed in response to design requirements without departing from the gist of the invention.

For example, it is also preferable that the contact angle of the functional liquid L placed in the second groove 56 about the bank member is smaller than the contact angle of the functional liquid L placed in the first groove 55 about the bank member.

What is claimed is:

1. A barrier structure provided with a concave portion, the barrier structure comprising:
    a first concave portion provided in the barrier to correspond to a first pattern; and
    a second concave portion that is connected to the first pattern and that is provided in the barrier to correspond to a second pattern having a width smaller than that of the first pattern,
    wherein the height of at least a part of the bottom surface of the second concave portion is greater than that of a bottom surface of the first concave portion,
    wherein the first and second concave portions provide an uncovered opening.

2. The barrier structure according to claim 1, wherein the barrier contains a photosensitive material.

3. The barrier structure according to claim 1, wherein the barrier contains a lyophilic material.

4. The barrier structure according to claim 1, wherein a contact angle of a functional liquid disposed in the second concave portion about the bottom surface of the second concave portion is smaller than or equal to a contact angle of the functional liquid disposed in the first concave portion about the bottom surface of the first concave portion.

5. A device comprising the barrier structure according to claim 1 and patterns formed in the first concave portion and the second concave portion of the barrier structure.

6. The device according to claim 5, wherein the first pattern is a gate wire and the second pattern is a gate electrode.

7. The device according to claim 5, wherein the first pattern is a source wire and the second pattern is a source electrode.

8. An electro-optical device comprising the device according to claim 7.

9. An electronic apparatus comprising the electro-optical device according to claim 8.

10. A method of forming a barrier structure having concave portions corresponding to a plurality of patterns on a substrate, the method comprising:
    applying a barrier material onto the substrate; and
    forming a barrier having a first concave portion corresponding to a first pattern and a second concave portion corresponding to a second pattern, which is connected to the first pattern and which has a width smaller than that of the first pattern,
    wherein in forming the barrier, a height of a bottom surface of the second concave portion is formed to be greater than that of a bottom surface of the first concave portion,
    wherein the first and second concave portions provide an uncovered opening.

11. The method of forming a barrier structure according to claim 10, wherein the barrier material applied onto the substrate is subjected to a lyophobic process.

12. The method of forming a barrier structure according to claim 10, wherein the second concave portion is formed using a half-tone exposure.

13. The method of forming a barrier structure according to claim 10, wherein a surface of the first concave portion on which the first pattern should be formed is subjected to a lyophobic process and a surface of the second concave portion on which the second pattern should be formed is subjected to a lyophilic process.

14. A method of forming a barrier structure having concave portions corresponding to a plurality of patterns on a substrate, the method comprising:
    applying a barrier material onto the substrate;
    applying a resist on the barrier material;
    patterning the resist in a predetermined shape; and
    forming a barrier having a first concave portion corresponding to a first pattern and a barrier having a second concave portion corresponding to a second pattern, which is connected to the first pattern and which has a width smaller than that of the first pattern, by etching the barrier material in predetermined patterns using the resist as a mask,
    wherein in forming the barrier, a height of a bottom surface of the second concave portion is fonned to be greater than that of a bottom surface of the first concave portion,
    wherein the first and second concave portions each provide an uncovered opening.

* * * * *